(12) United States Patent
Shim et al.

(10) Patent No.: US 8,558,958 B2
(45) Date of Patent: Oct. 15, 2013

(54) ARRAY SUBSTRATE FOR LIQUID CRYSTAL DISPLAY DEVICE, LIQUID CRYSTAL DISPLAY DEVICE AND METHOD OF FABRICATING THE SAME

(75) Inventors: Seok Ho Shim, Gyeongsangbuk-do (KR); Dae Young Seok, Daegu (KR)

(73) Assignee: LG Display Co., Ltd., Seoul (KR)

( * ) Notice: Subject to any disclaimer, the term of this patent is extended or adjusted under 35 U.S.C. 154(b) by 578 days.

(21) Appl. No.: 12/782,302

(22) Filed: May 18, 2010

(65) Prior Publication Data

US 2011/0096258 A1    Apr. 28, 2011

(30) Foreign Application Priority Data

Oct. 27, 2009  (KR) .................. 10-2009-0102511
Oct. 29, 2009  (KR) .................. 10-2009-0103528

(51) Int. Cl.
    *G02F 1/1343*    (2006.01)
(52) U.S. Cl.
    USPC ............................ 349/39; 349/58
(58) Field of Classification Search
    USPC ........................... 349/39, 58, 149
    See application file for complete search history.

(56) References Cited

U.S. PATENT DOCUMENTS

2010/0110359 A1*  5/2010  Lee et al. .................. 349/149

* cited by examiner

*Primary Examiner* — Eric Wong
(74) *Attorney, Agent, or Firm* — Morgan, Lewis & Bockius LLP

(57) ABSTRACT

An array substrate for a liquid crystal display device includes a gate line on a substrate including a display region and a non-display region at a periphery of the display region; a common line on the substrate; a data drive integrated circuit in the non-display region; first and second data lines crossing the gate line to define a pixel region in the display region, the first and second data lines having a difference in a distance from the data drive integrated circuit; first and second data link lines connected to the data drive integrated circuit, the first and second data link lines respectively connected to the first and second data lines; a thin film transistor in the pixel region connected to the gate line and one of the first and second data lines; a pixel electrode in the pixel region and connected to the thin film transistor; and a first conductive pattern in the non-display region and connected to the common line such that a common voltage is applied to the first conductive pattern, the first conductive pattern overlapping the first and second data link lines to form first and second capacitors, respectively.

22 Claims, 12 Drawing Sheets

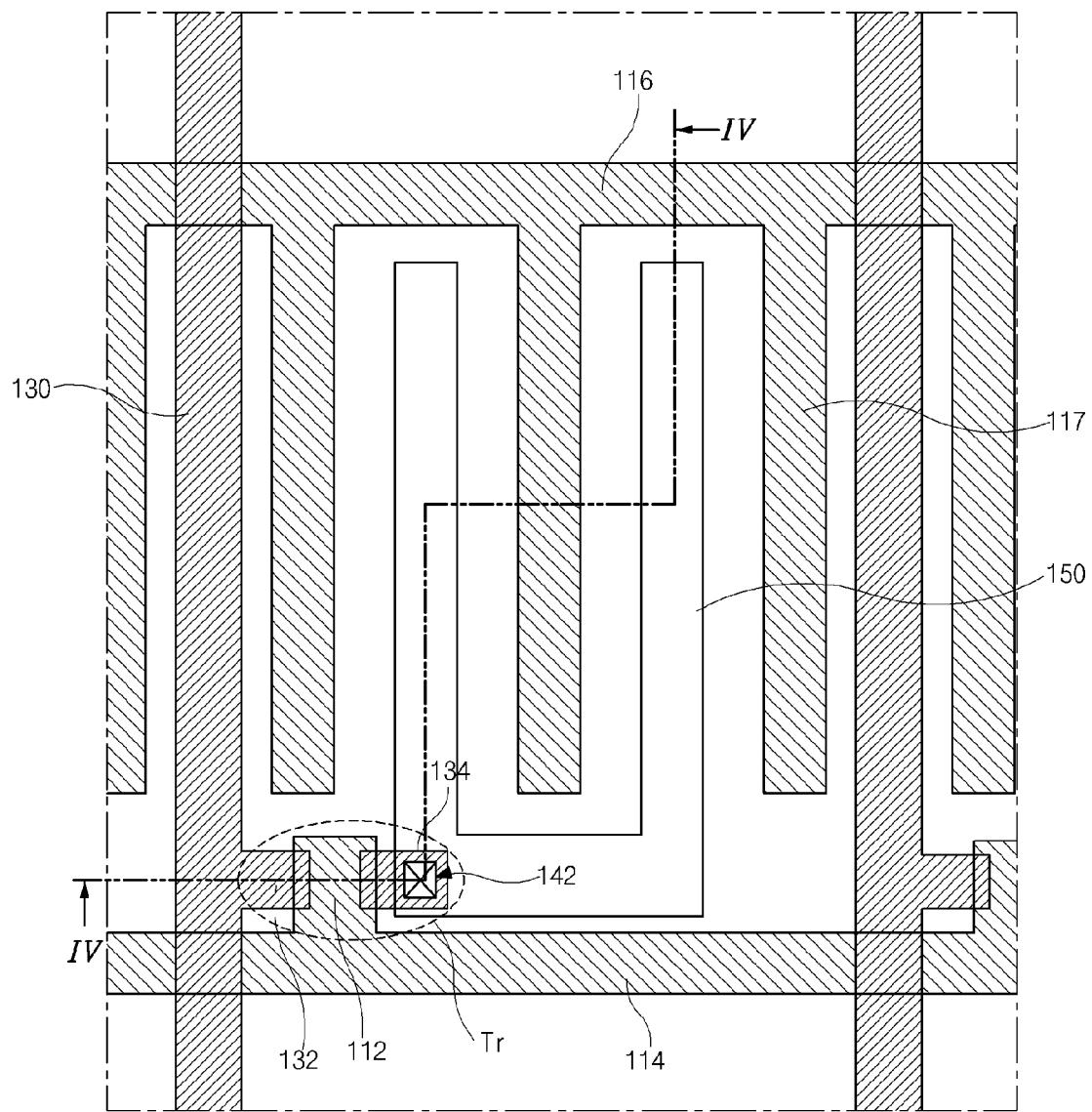

ARRAY SUBSTRATE FOR LIQUID CRYSTAL DISPLAY DEVICE, LIQUID CRYSTAL DISPLAY DEVICE AND METHOD OF FABRICATING THE SAME

The present application claims the benefit of Korean Patent Application Nos. 2009-0102511 and 2009-0103528, filed in Korea on Oct. 27, 2009 and Oct. 29, 2009, respectively, both of which are herein incorporated by reference.

BACKGROUND OF THE INVENTION

1, Field of the Invention

The present invention relates to a liquid crystal display (LCD) device and more particularly to an array substrate for an LCD device and an LCD device being capable of uniformizing a signal delay in link lines, and a method of fabrication the array substrate and the LCD device.

2, Discussion of the Related Art

A related art liquid crystal display (LCD) device uses optical anisotropy and polarization properties of liquid crystal molecules. The liquid crystal molecules have a definite alignment direction as a result of their thin and long shapes. The alignment direction of the liquid crystal molecules can be controlled by applying an electric field across the liquid crystal molecules. In other words, as the intensity or direction of the electric field is changed, the alignment of the liquid crystal molecules also changes. Since incident light is refracted based on the orientation of the liquid crystal molecules due to the optical anisotropy of the liquid crystal molecules, images can be displayed by controlling light transmissivity.

Since the LCD device including a thin film transistor (TFT) as a switching element, referred to as an active matrix LCD (AM-LCD) device, has excellent characteristics of high resolution and displaying moving images, the AM-LCD device has been widely used.

The AM-LCD device includes an array substrate, a color filter substrate and a liquid crystal layer interposed therebetween. The array substrate may include a pixel electrode and the TFT, and the color filter substrate may include a common electrode. The AM-LCD device is driven by an electric field between the pixel electrode and the common electrode to have excellent properties of transmittance and aperture ratio.

FIG. 1 is a plane view of an array substrate for the related art LCD device. In FIG. 1, the array substrate includes a substrate 11, where a display region DR and a non-display region NDR at a periphery of the display region DR are defined, a gate line 13 and a data line 15. The gate line 13 crosses the data line 15 to define a pixel region in the display region DR.

Although not shown, a thin film transistor (TFT) connected to the gate and data lines 13 and 15 and a pixel electrode connected to the TFT are disposed in the pixel region P.

In the non-display region NDR, a gate drive integrated circuit (IC) 20 for applying a signal to the gate line 13 to drive the TFT and a data drive IC 30 for applying a signal to the pixel electrode through the data line 15 are disposed. In addition, a gate link line 14 for connecting the gate drive IC 20 to the gate line 13 and a data link line 16 for connecting the data drive IC 30 to the data line 15 are disposed in the non-display region NDR.

For example, the gate drive IC 20 includes first to third gate drive ICs 20a, 20b and 20c, and the gate lines 13 are connected to the first to third gate drive ICs 20a, 20b and 20c via the gate link lines 14. The data drive IC 30 includes first to fourth data drive ICs 30a, 30b, 30c and 30d, and the data lines 15 are connected to the first to fourth data drive ICs 30a, 30b, 30c and 30d via the data link lines 16.

In this case, the data link lines 16 have a difference in a length depending on a position of the data lines 16 such that a resistance deviation is generated in the data link line 16. Namely, the data link line 16 connected to the data line 15, which is adjacent to the gate drive IC 20 and connected to the first data drive IC 20a, has a different resistance than other data link lines 16. The resistance deviation is increased as a size of the substrate 11 is enlarged. This resistance deviation problem is also generated in the data link lines 16 connected to the second to fourth data drive ICs 20b, 20c and 20d, In addition, the resistance deviation problem is generated in the gate link line 14 connected to the gate drive IC 20.

A signal delay is generated by the resistance deviation problem such that a displaying image quality is degraded.

To these problems, an array substrate including a data link line or a gate link line having a zigzag shape is introduced. FIG. 2 is a plane view showing a data link line having a zigzag shape in the related art array substrate.

In FIG. 2, a data line 60 and a data drive IC 70 for applying a signal to the data line 60 are disposed on the substrate 51. In addition, a data link line 62 for connecting the data drive IC 70 to the data line 60 is disposed on the substrate 51.

The data line 60 includes first to third data lines 60a, 60b and 60c, The first to third data lines 60a, 60b and 60c are classified by a distance from the data line at a center line of the data drive IC 70, which is called as a center data line 60. Namely, the first data line 60a has a first distance from the center data line 60, the second data line 60b has a second distance, which is smaller than the first distance, from the center data line 60, and the third data line 60c has a third distance, which is smaller than the second distance, from the center data line 60. The data link line 62 is also classified into first to third data link lines 62a, 62b and 62c respectively connected to the first to third data lines 60a, 60b and 60c, Each data link lines 62a, 62b and 62c has a zigzag shape. A number of the zigzag shape is different in the first to third data link lines 62a, 62b and 62c, Namely, the first data link line 62a connected to the first data line 60a, which has the largest distance from the center data line 60, has the lowest number of zigzag shapes, while the third data link line 62c connected to the third data line 60c, which has the smallest distance from the center data line 60, has the greatest number of zigzag shapes. As a result, a length of the first to third data link lines 62a, 62b and 62c can be uniformed without regard for their distance from the center data line 60 such that a signal delay problem by a resistance deviation of the data link lines 62a, 62b and 62c can be prevented.

Unfortunately, there are still problems. Particularly, the problem appears in a narrow bezel type LCD device. In the narrow bezel type to reduce a size of the LCD device, it is required to minimize an area of the non-display region. In this case, there is a limitation for uniformizing a resistance of the data link lines by controlling a number of zigzag shapes of the data link lines.

SUMMARY OF THE INVENTION

Accordingly, the present invention is directed to an array substrate, an LCD device and a method of fabrication the same that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an array substrate for a liquid crystal display device includes a gate line on a substrate including a display region and a non-display region at a periphery of the display region; a common line on the substrate; a data drive integrated circuit in the non-display region; first and second data lines crossing the gate line to define a pixel region in the display region, the first and second data lines having a difference in a distance from the data drive integrated circuit; first and second data link lines connected to the data drive integrated circuit, the first and second data link lines respectively connected to the first and second data lines; a thin film transistor in the pixel region connected to the gate line and one of the first and second data lines; a pixel electrode in the pixel region and connected to the thin film transistor; and a first conductive pattern in the non-display region and connected to the common line such that a common voltage is applied to the first conductive pattern, the first conductive pattern overlapping the first and second data link lines to form first and second capacitors, respectively.

In another aspect of the present invention, a method of fabricating an array substrate for a liquid crystal display device includes forming a gate line and a common line on a substrate including a display region and a non-display region at a periphery of the display region; forming first and second data lines and first and second data link lines, the first and second data line crossing the gate line to define a pixel region in the display region, the first and second data link lines respectively connected to the first and second data lines; forming a thin film transistor in the pixel region and connected to the gate line and one of the first and second data lines; forming a pixel electrode and a first conductive pattern, the pixel electrode in the pixel region and connected to the thin film transistor, the first conductive pattern in the non-display region and connected to the common line such that a common voltage is applied to the first conductive pattern, the first conductive pattern overlapping the first and second data link lines to form first and second capacitors, respectively; and forming a data drive integrated circuit in the non-display region and connected to each of the first and second data link lines, wherein the first and second data lines have a difference in a distance from the data drive integrated circuit.

In another aspect of the present invention, a liquid crystal display device includes a gate line on a first substrate including a display region and a non-display region at a periphery of the display region; a data drive integrated circuit in the non-display region; first and second data lines crossing the gate line to define a pixel region in the display region and having a difference in a distance from the data drive integrated circuit; first and second data link lines connected to the data drive integrated circuit, the first and second data link lines respectively connected to the first and second data link lines; a thin film transistor in the pixel region connected to the gate line and one of the first and second data lines; a pixel electrode in the pixel region and connected to the thin film transistor; a first conductive pattern in the non-display region and overlapping the first and second data link lines to form first and second capacitors, respectively; a common electrode on a second substrate facing the first substrate and covering the display region and the non-display region; a seal pattern in the non-display region and contacting the common electrode and the first conductive pattern, the sea pattern having a conductive property; and a liquid crystal layer between the first and second substrates.

In another aspect of the present invention, a method of fabricating a liquid crystal display device includes forming a gate line on a first substrate including a display region and a non-display region at a periphery of the display region; forming first and second data lines crossing the gate line to define a pixel region in the display region; forming first and second data link lines respectively connected to the first and second data lines; forming a thin film transistor in the pixel region connected to the gate line and one of the first and second data lines; forming a pixel electrode and a first conductive pattern, the pixel electrode in the pixel region and connected to the thin film transistor, the first conductive pattern in the non-display region and overlapping the first and second data link lines to form first and second capacitors, respectively; forming a data drive integrated circuit in the non-display region and connected to each of the first and second data link lines; forming a common electrode on a second substrate and covering the display region and the non-display region; forming a seal pattern having a conductive property in the non-display region of the first substrate and the second substrate; attaching the first and second substrate such that the seal pattern contacting the common electrode and the first conductive pattern; and forming a liquid crystal layer between the first and second substrates, wherein the first and second data lines have a difference in a distance from the data drive integrated circuit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 3B is an enlarged plane view of one pixel region in FIG. 3A.

DETAILED DESCRIPTION OF THE PREFERRED EMBODIMENTS

Reference will now be made in detail to the preferred embodiments, examples of which are illustrated in the accompanying drawings.

Figure 1:
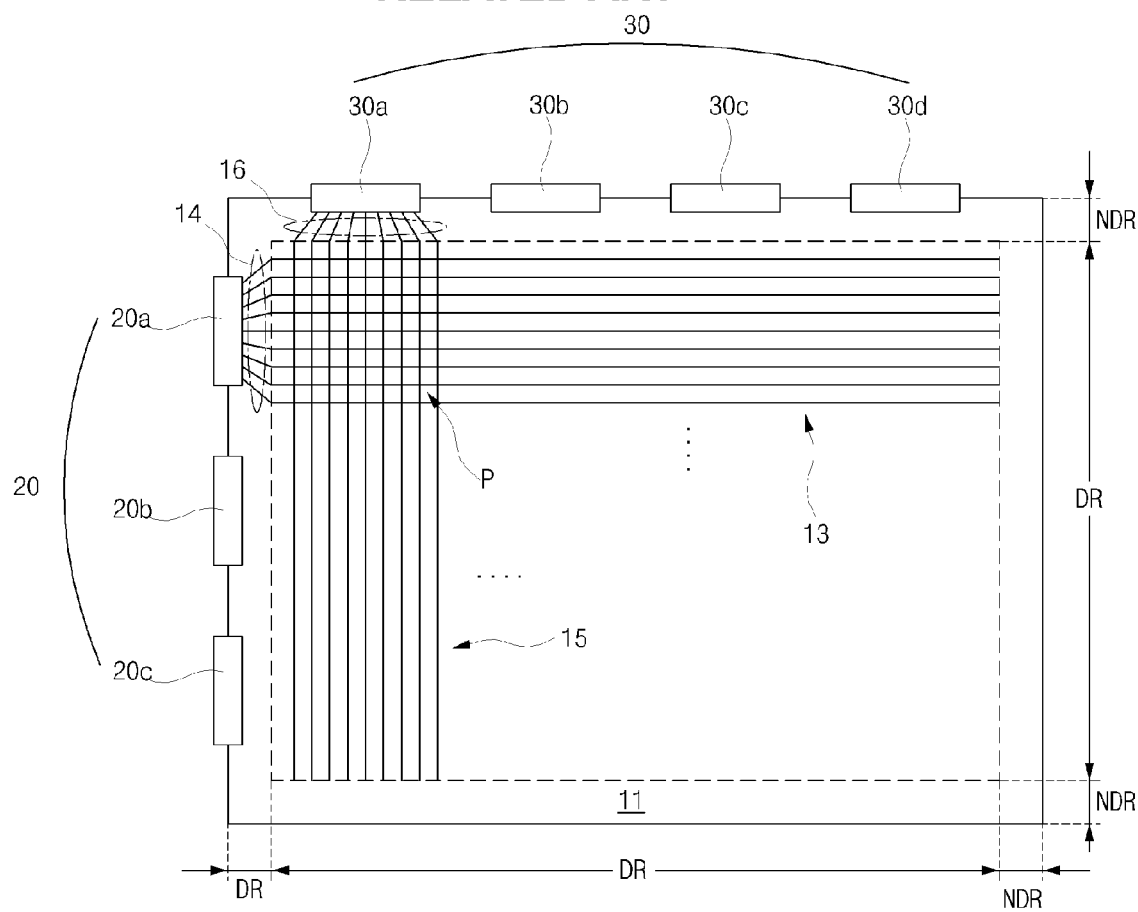
FIG. 1 is a plane view of an array substrate for the related art LCD device.
Figure 2:
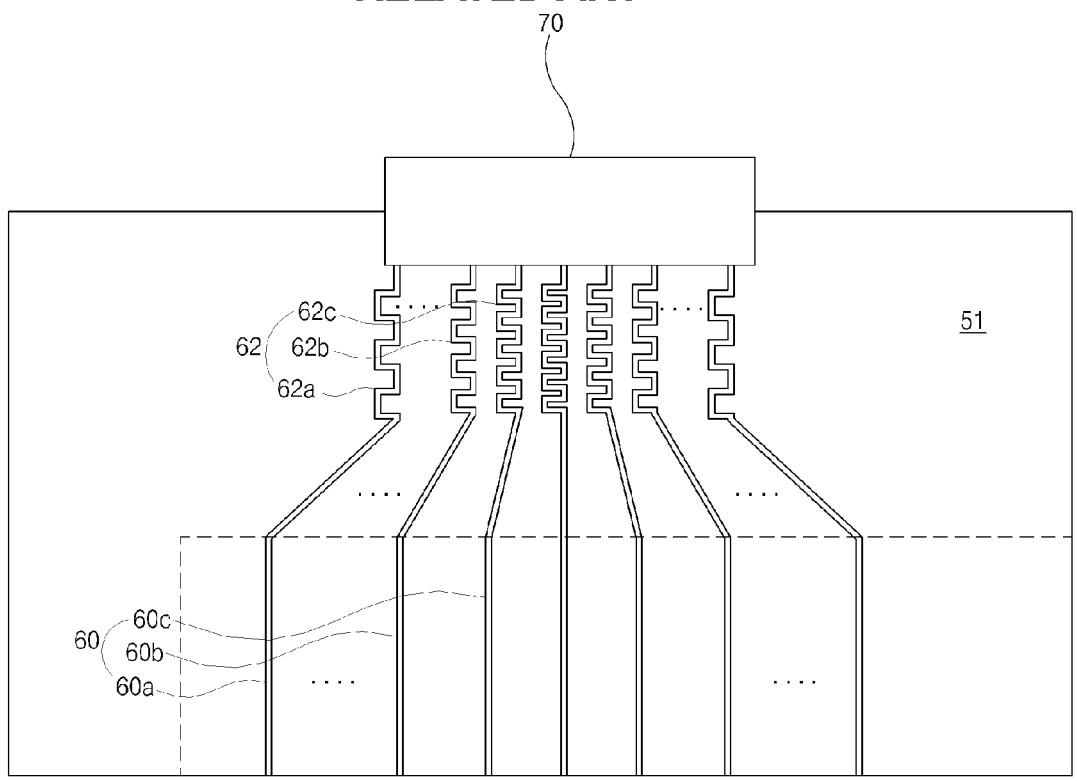
FIG. 2 is a plane view showing a data link line having a zigzag shape in the related art array substrate.
Figure 3A:
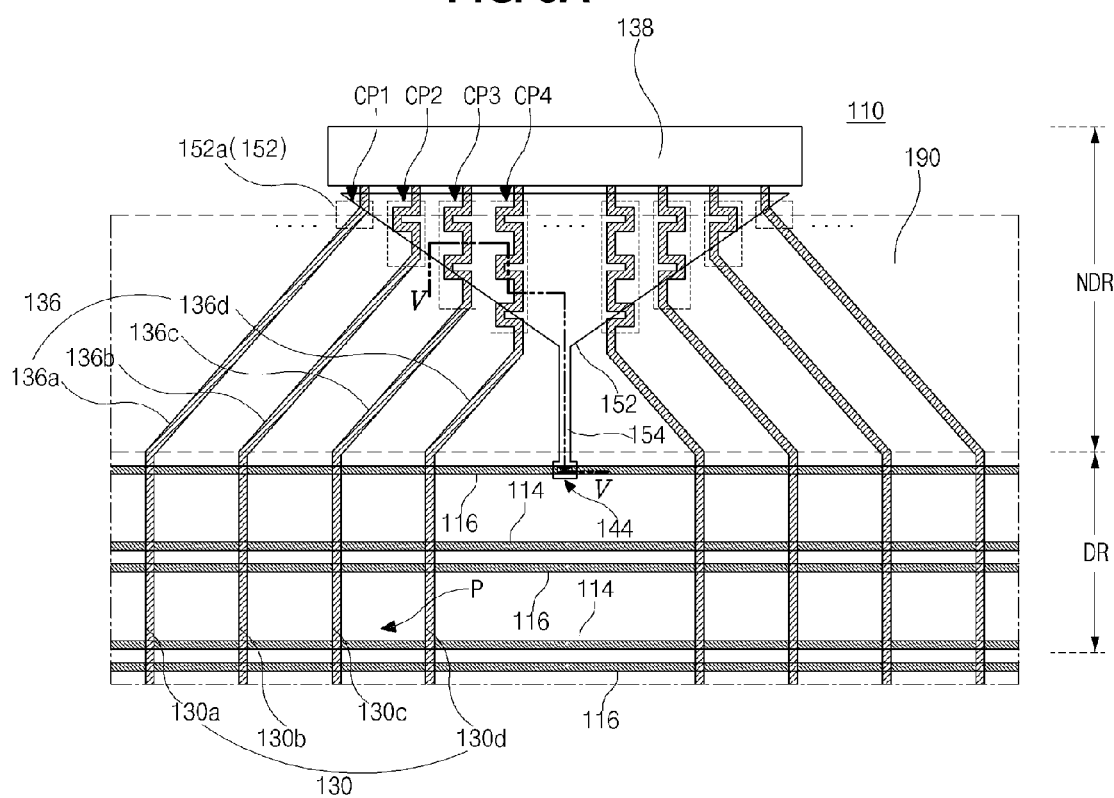
FIG. 3A is a plane view of an array substrate for an LCD device according to a first embodiment of the present invention.

FIG. 3A is a plane view of an array substrate for an LCD device according to a first embodiment of the present invention, and FIG. 3B is an enlarged plane view of one pixel region in FIG. 3A.

In FIGS. 3A and 3B, the array substrate 100 for the LCD device includes a substrate 110 where a display region DR and a non-display region NDR at a periphery of the display region DR are defined.

A plurality of gate lines 114 along a first direction and a plurality of data lines 130 are disposed on the substrate 110. The gate lines 114 and the data lines 130 cross each other to define a plurality of pixel regions P in the display region DR.

A plurality of common lines 116, which extends along the first direction, are disposed on the substrate 110. The common line 116 is parallel to and spaced apart from the gate line 114 and positioned between adjacent two gate lines 114. The common lines 116 also cross the data lines 130.

A plurality of data link lines 136 respectively extending from the data lines 130 are disposed in the non-display region NDR. Although not shown, an end of the data link line 136 is defined as a data pad, and a data pad electrode contacting the data pad is disposed on the data pad.

A data drive IC 138 for applying a signal to the data line 130 is disposed in the non-display region NDR. The data drive IC 138 is electrically connected to each data link line 136. Namely, the data drive IC 138 contacts the data pad electrode (not shown) to be electrically connected to the data link line 136.

A first conductive pattern 152 having a triangle shape and overlapping the data link line 136 is disposed in the non-display region NDR. The first conductive pattern 152 having a reverse-triangle shape is shown.

A connection part 154 extends from the first conductive pattern 152 along the second direction. The connection part 154 contacts the outmost common line 116 through a common contact hole 144 exposing the outmost common line 116 such that the first conductive pattern 152 is electrically connected to the outmost common line 116.

A thin film transistor (TFT) Tr connected to the gate and data lines 114 and 130 is disposed in the pixel region P. The TFT Tr includes a gate electrode 112, a gate insulating layer (not shown), a semiconductor layer (not shown), which includes an active layer (not shown) of intrinsic amorphous silicon and ah ohmic contact layer (not shown) of impurity-doped amorphous silicon, a source electrode 132 and a drain electrode 134. The gate electrode 112 is connected to the gate line 114, and the gate insulating layer covers the gate electrode 112. The semiconductor layer is disposed on the gate insulating layer and overlaps the gate electrode 112. The source and drain electrodes 132 and 134 are disposed on the semiconductor layer. The source electrode 132 is connected to the data line 130 and spaced apart from the drain electrode 134. A portion of the ohmic contact layer corresponding to a space between the source and drain electrodes 132 and 134 is removed such that a center of the active layer is exposed through the space between the source and drain electrodes 132 and 134.

A passivation layer (not shown) covers the TFT Tr and includes a drain contact hole 142 exposing the drain electrode 134. A pixel electrode 150 including a plurality of pixel branches is disposed on the passivation layer and in the pixel region P. The pixel electrode 150 contacts the drain electrode 134 through the drain contact hole 142. A common electrode 117 including a plurality of common branches and connected to the common line 116 are disposed in the pixel region P. The common branches are alternately arranged with the pixel branches 150.

In FIG. 3A, each of the pixel electrode 150 and the common electrode 117 has a straight linear shape. Alternatively, each of the pixel electrode 150 and the common electrode 117 may have a bent shape to form multi-domains. In FIG. 3A, the common electrode 117 is disposed at the same layer as the common line 116 and extends from the common line 116. Alternatively, the common electrode 117 may be disposed at the same layer as the pixel electrode 150 and connected to the common line 116 through a contact hole.

The data lines 130 are classified into first to fourth data lines 130a, 130b, 130c and 130d depending on a distance from the center data line 130, which is disposed at a center line of the data drive IC 138, and the data link lines 136 are also classified into first to fourth data link lines 136a, 136b, 136c and 136d depending on a distance from the center data line 130. The first to fourth data link lines 136a, 136b, 136c and 136d respectively connected to the first to fourth data lines 130a, 130b, 130c and 130d, Namely, the first data line 130a has a first distance from the center data line 130 or the data drive IC 138, and the second data line 130b has a second distance, which is smaller than the first distance, from the center data line 130 or the data drive IC 138. The third data line 130c has a third distance, which is smaller than the second distance, from the center data line 130 or the data drive IC 138, and the fourth data line 130d has a fourth distance, which is smaller than the third distance, from the center data line 130 or the data drive IC 138.

At least one of the first to fourth data link lines 136a, 136b, 136c and 136d has a zigzag shape, i.e., a "S"-shape. The first to fourth data link lines 136a, 136b, 136c and 136d have a difference in a number of the zigzag shape such that a length of the first to fourth data link lines 136a, 136b, 136c and 136d is controlled. Namely, as the farther the data link line is from the center data line, as the smaller number of the zigzag shape the data link line has. Alternatively, the first to fourth data link lines 136a, 136b, 136c and 136d have a straight linear shape. Alternatively, the first to fourth data link lines 136a, 136b, 136c and 136d may have a difference in a width to control a resistance. Namely, the first data link line 136a, which has the largest distance from the center data line 130, has the largest width, and the fourth data link line 136d, which has the smallest distance from the center data line 130, has the smallest width. As a result, a resistance deviation by a distance difference from the data drive IC 138 is compensated.

As mentioned above, the first conductive pattern 152 is electrically connected to the outmost common line 116 via the connection part 154 such that a common voltage is applied to the first conductive pattern 152. Since the first conductive pattern 152 has a triangle shape, the first conductive pattern 152 has a difference in an overlapped area with the first to fourth data link lines 136a, 136b, 136c and 136d, Namely, the first conductive pattern 152 has a first overlapped area with the first data link line 136a and a second overlapped area, which is larger than the first overlapped area, with the second data link line 136b, The first conductive pattern 152 has a third overlapped area, which is larger than the second overlapped area, with the third data link line 136c and a fourth overlapped area, which is larger than the third overlapped area, with the fourth data link line 136d, Namely, an overlapped area of the first conductive pattern 152 and respective data link lines 136a, 136b, 136c and 136d is in reverse proportional to a distance between respective data lines 130a, 130b, 130c and 130d and the data drive IC 138.

Since the passivation layer (not shown) is disposed under the first conductive pattern 152 and on the first to fourth data link lines 136a, 136b, 136c and 136d, first to fourth capacitors Cp1, Cp2, Cp3 and Cp4 are generated. Namely, the first conductive pattern 152, the first data link line 136a and the passivation layer constitute the first capacitor Cp1, and the second conductive pattern 152, the second data link line 136b and the passivation layer constitute the second capacitor Cp2. The first conductive pattern 152, the third data link line 136c and the passivation layer constitute the third capacitor Cp3, and the second conductive pattern 152, the fourth data link line 136d and the passivation layer constitute the fourth capacitor Cp4.

As mentioned above, an overlapped area between the first conductive pattern 152 and the first data link line 136a is smallest, and an overlapped area between the first conductive pattern 152 and the fourth data link line 136d is largest. Accordingly, capacitance of each of the second and third capacitors Cp2 and Cp3 is larger than that of the first capacitor Cp1 and smaller than that of the fourth capacitor Cp4, and capacitance of the second capacitor Cp2 is smaller than that of the third capacitor Cp3. A signal through the data link lines 136 is delayed by the capacitors Cp1, Cp2, Cp3 and Cp4 such that a signal delay is uniformed in the first to fourth data link lines 136a, 136b, 136c and 136d due to the first to fourth capacitors Cp1, Cp2, Cp3 and Cp4 having a difference in capacitance. Particularly, without requirement in increasing of a size of the non-display region NDR, the signal delay is uniformed due to the first conductive pattern 152. Accordingly, the array substrate is adequate to the narrow bezel type LCD device.

Although not shown, gate link lines extend from the gate lines 114 to the non-display region NDR, and a second conductive pattern is disposed to overlap the gate link lines. Similar to the first conductive pattern 152, a signal delay in the gate link lines is uniformed due to the second conductive pattern.

Figure 4:
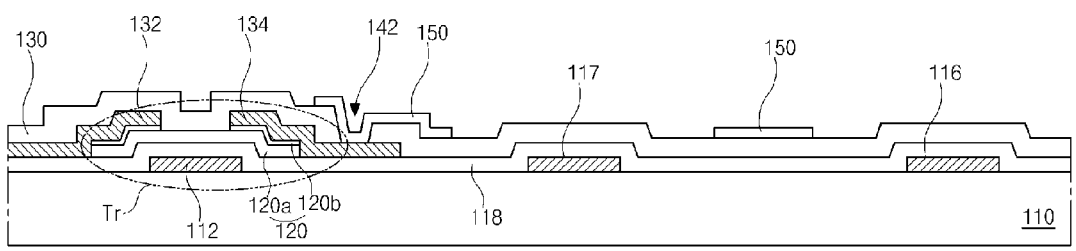
FIG. 4 is a cross-sectional view taken along the line IV-IV of FIG. 3B.
Figure 5:
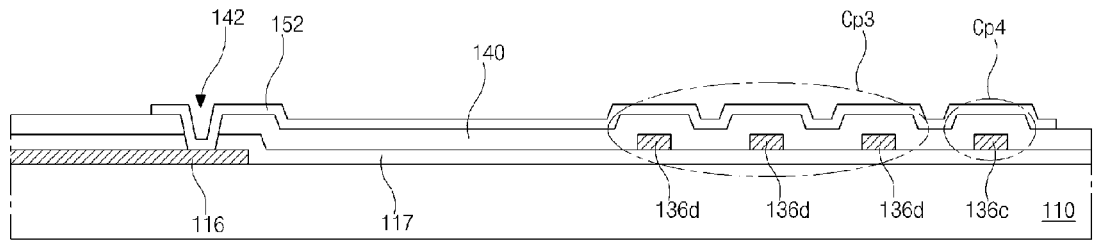
FIG. 5 is a cross-sectional view taken along the line V-V of FIG. 3A.

FIG. 4 is a cross-sectional view taken along the line IV-IV of FIG. 3B, and FIG. 5 is a cross-sectional view taken along the line V-V of FIG. 3A.

Referring to FIGS. 3A to 5, the gate line 114 along the first direction, the gate electrode 112 extending from the gate line 114, and the common line 116 along the first direction and spaced apart from the gate line 114 are disposed on the substrate 110. The common electrode 117 including the common branches extending from the common line 116 is disposed on the substrate 110 and in the pixel region P. In addition, the gate link lines (not shown) extending from the gate line 114 to the non-display region NDR are disposed on the substrate 110. An end of the gate link line is defined as a gate pad.

The gate line 114, the gate electrode 112, the common line 116, the common electrode 117 and the gate link lines are formed of a first metallic material, for example, aluminum (Al), Al alloy, molybdenum (Mo), copper (Cu) or Cu alloy. The Al alloy may be Al-neodymium (AlNd).

The gate insulating layer 118 is disposed on the gate line 114, the gate electrode 112, the common line 116, the common electrode 117 and the gate link lines. The gate insulating layer 118 is formed of an inorganic insulating material, for example, silicon oxide or silicon nitride.

The semiconductor layer 120 is disposed on the gate insulating layer 118 and corresponds to the gate electrode 112. The semiconductor layer 120 includes the active layer 120a of intrinsic amorphous silicon and the ohmic contact layer 120b of impurity-doped amorphous silicon.

The source and drain electrodes 132 and 134 spaced apart from each other are disposed on the semiconductor layer. The data line 130 connected to the source electrode 132 is disposed on the gate insulating layer 118 and crosses the gate line 114 to define the pixel region P. A portion of the ohmic contact layer corresponding to a space between the source and drain electrodes 132 and 134 is removed such that a center of the active layer is exposed through the space between the source and drain electrodes 132 and 134.

The gate electrode 112, the gate insulating layer 118, the semiconductor layer 120, the source electrode 132 and the drain electrode 134 constitute the TFT Tr. Namely, the TFT Tr in the pixel region P is connected to the gate and data lines 114 and 130.

In addition, the data link lines 136 extending from the data line 130 is disposed on the gate insulating layer 118 and in the non-display region NDR. An end of the data link line 136 is defined as a data pad.

The data line 130, the source electrode 132, the drain electrode and the data link lines 136 are formed of a second metallic material, for example, aluminum (Al), Al alloy, molybdenum (Mo), copper (Cu) or Cu alloy. The Al alloy may be Al-neodymium (AlNd).

The data lines 130 and the data link lines 136 are respectively classified into the first to fourth data lines 130a, 130b, 130c and 130d and into the first to fourth data link lines 136a, 136b, 136c and 136d depending on a distance from the center data line 130 corresponding to a center of the data drive IC 138.

The first data line 130a has the first distance from a center of the data drive IC 138, i.e., the center data line 130, and the second data line 130b has the second distance, which is smaller than the first distance, from the center of the data drive IC 138. The third data line 130c has the third distance, which is smaller than the second distance, from a center of the data drive IC 138, and the fourth data line 130d has the fourth distance, which is smaller than the third distance, from the center of the data drive IC 138. The first to fourth data link lines 136a, 136b, 136c and 136d are respectively connected to the first to fourth data lines 130a, 130b, 130c and 130d, At least one data link line of the first to fourth data link lines 136a, 136b, 136c and 136d has a zigzag shape. A number of the zigzag shape is various such that a length of the first to fourth data link lines 136a, 136b, 136c and 136d is uniformed without regard for their position with respect to the data drive IC 138.

The passivation layer 140 including the common contact hole 144, which exposes the outmost common line 116, and the drain contact hole 142, which exposes the drain electrode 134, is disposed on the source electrode 132, the drain electrode 134, the data line 130 and the data link line 136. The passivation layer 140 is formed of an inorganic insulating material, for example, silicon nitride or silicon oxide, or an organic insulating material, for example, benzocyclobutene or photo-acryl. Since the common line 116 is disposed under the gate insulating layer 118, the common contact hole 144 is formed through not only the passivation layer 140 but also the gate insulating layer 118.

Although not shown, the passivation layer 140 includes contact holes respectively exposing the gate pad and the data pad.

The pixel electrode 150 is disposed on the passivation layer 140 in the pixel region P. The pixel electrode 150 including the pixel branches contacts the drain electrode 134 through the drain contact hole 142. The pixel branches are alternately arranged with the common branches. The pixel electrode 150 generates a horizontal electric field with the common electrode 117.

The first conductive pattern 152 is disposed on the passivation layer 140 and in the non-display region NDR. The first conductive pattern 152 overlaps the first to fourth data link line 136a, 136b, 136c and 136d, The first conductive pattern 152 has a triangle shape such that an overlapped area between the first conductive pattern 152 and the first to fourth data link line 136a, 136b, 136c and 136d is various. The connection part 154, which extends from the first conductive pattern 152, contacts the outmost common line 116 through the common contact hole 144 such that the first conductive pattern 152 is electrically connected to the outmost common line 116.

The pixel electrode 150, the first conductive pattern 152 and the connection part 154 are formed of one of indium-tin-oxide (ITO), indium-zinc-oxide (IZO) and molybdenum-titanium alloy (MoTi).

Since the passivation layer 140 is disposed under the first conductive pattern 152 and on the first to fourth data link lines 136a, 136b, 136c and 136d, first to fourth capacitors Cp1, Cp2, Cp3 and Cp4 are generated. Namely, the first conductive pattern 152, the first data link line 136a and the passivation layer constitute the first capacitor Cp1, and the second conductive pattern 152, the second data link line 136b and the passivation layer constitute the second capacitor Cp2. The first conductive pattern 152, the third data link line 136c and the passivation layer constitute the third capacitor Cp3, and the second conductive pattern 152, the fourth data link line 136d and the passivation layer constitute the fourth capacitor Cp4.

Although not shown, a gate link lines extend from the gate line 114 to the non-display region NDR, and a second conductive pattern is disposed to overlap the gate link lines. Similar to the first conductive pattern 152, a signal delay in the gate link lines is uniformed due to the second conductive pattern.

As mentioned above, an overlapped area between the first conductive pattern 152 and the first data link line 136a is smallest, and an overlapped area between the first conductive pattern 152 and the fourth data link line 136d is largest. Accordingly, capacitance of each of the second and third capacitors Cp2 and Cp3 is larger than that of the first capacitor Cp1 and smaller than that of the fourth capacitor Cp4, and capacitance of the second capacitor Cp2 is smaller than that of the third capacitor Cp3. A signal through the data link lines 136 is delayed by the capacitors Cp1, Cp2, Cp3 and Cp4 such that a signal delay is uniformed in the first to fourth data link lines 136a, 136b, 136c and 136d due to the first to fourth capacitors Cp1, Cp2, Cp3 and Cp4 having a difference in capacitance.

Figure 6A:
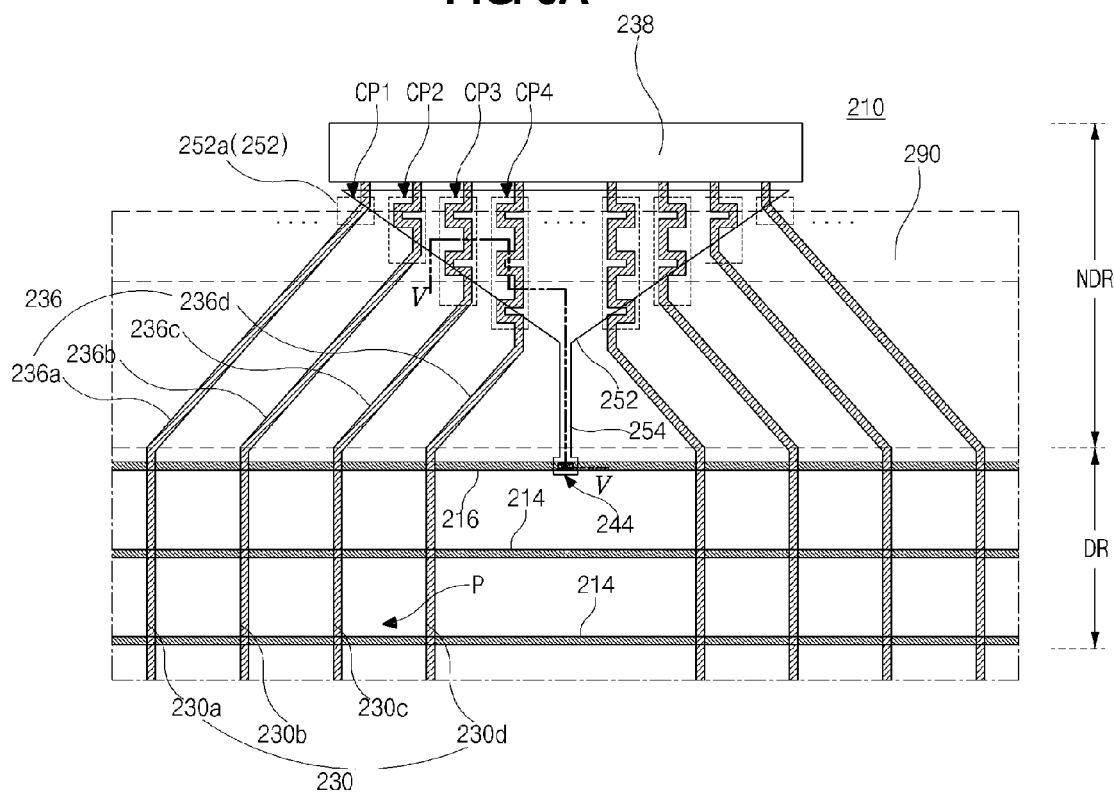
FIG. 6A is a plane view of an array substrate for an LCD device according to a second embodiment of the present invention.
Figure 6B:
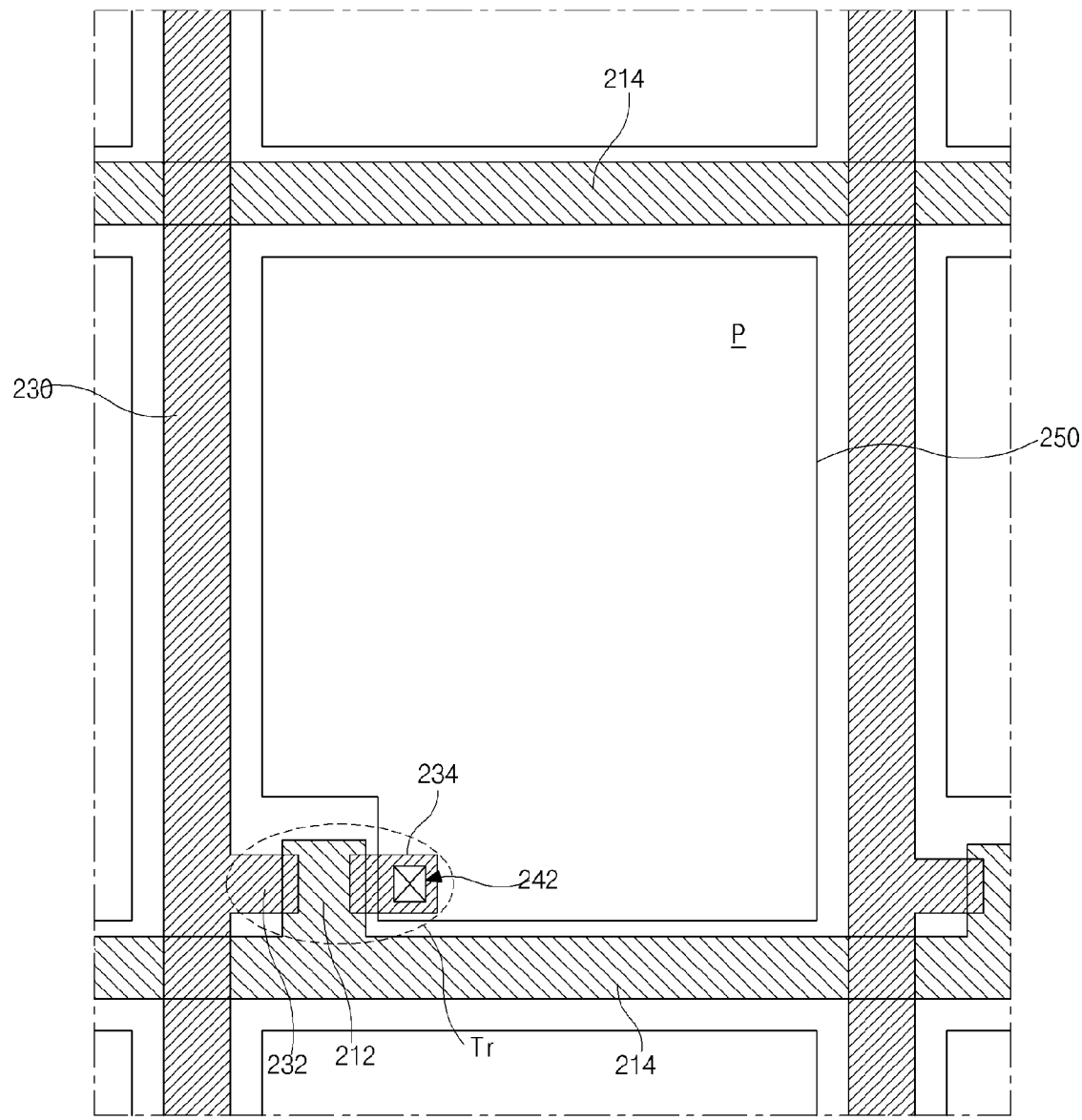
FIG. 6B is an enlarged plane view of one pixel region in FIG. 6A.

FIG. 6A is a plane view of an array substrate for an LCD device according to a second embodiment of the present invention, and FIG. 6B is an enlarged plane view of one pixel region in FIG. 6A.

In FIG. 6A and 6B, the array substrate 200 for the LCD device includes a first substrate 210 where a display region DR and a non-display region NDR at a periphery of the display region DR are defined.

A plurality of gate lines 214 along a first direction and a plurality of data lines 230 are disposed on the first substrate 210. The gate lines 214 and the data lines 230 cross each other to define a plurality of pixel regions P in the display region DR.

A common line 216 is disposed on the first substrate 210 and in the non-display region NDR. Although not shown, the common line 216 applies a common voltage to a common electrode having a plate shape and disposed on a second substrate facing the first substrate 210.

A plurality of data link lines 236 respectively extending from the data lines 230 are disposed in the non-display region NDR. Although not shown, an end of the data link line 236 is defined as a data pad, a data pad electrode contacting the data pad is disposed on the data pad.

A data drive IC 238 for applying a signal to the data line 230 is disposed in the non-display region NDR. The data drive IC 238 is electrically connected to each data link line 236. Namely, the data drive IC 238 contacts the data pad electrode (not shown) to be electrically connected to the data link line 236.

A first conductive pattern 252 having a triangle shape and overlapping the data link line 236 is disposed in the non-display region NDR. The first conductive pattern 252 having a reverse-triangle shape is shown.

A connection part 254 extends from the first conductive pattern 252 along the second direction. The connection part 254 contacts the common line 216 through a common contact hole 244 exposing the common line 216 such that the first conductive pattern 252 is electrically connected to the common line 216.

A thin film transistor (TFT) Tr connected to the gate and data lines 214 and 230 is disposed in the pixel region P. The TFT Tr includes a gate electrode 212, a gate insulating layer (not shown), a semiconductor layer (not shown), which includes an active layer (not shown) of intrinsic amorphous silicon and ah ohmic contact layer (not shown) of impurity-doped amorphous silicon, a source electrode 232 and a drain electrode 234. The gate electrode 212 is connected to the gate line 214, and the gate insulating layer covers the gate electrode 212. The semiconductor layer is disposed on the gate insulating layer and overlaps the gate electrode 212. The source and drain electrodes 232 and 234 are disposed on the semiconductor layer. The source electrode 232 is connected to the data line 230 and spaced apart from the drain electrode 234. A portion of the ohmic contact layer corresponding to a space between the source and drain electrodes 232 and 234 is removed such that a center of the active layer is exposed through the space between the source and drain electrodes 232 and 234.

A passivation layer (not shown) covers the TFT Tr and includes a drain contact hole 242 exposing the drain electrode 234. A pixel electrode 250 having a plate shape is disposed on the passivation layer and in the pixel region P. The pixel electrode 250 contacts the drain electrode 234 through the drain contact hole 242. The pixel electrode 250 is formed of a transparent conductive material, for example, ITO or IZO.

The pixel electrode 250 generates a vertical electric field with the common electrode (not shown) on the second substrate (not shown). The common electrode is connected to the common line 216 on the first substrate 210 through a conductive dot. The conductive dot may be formed of silver.

The data lines 230 are classified into first to fourth data lines 230a, 230b, 230c and 230d depending on a distance from the center data line 230, which is disposed at a center line of the data drive IC 238, and the data link lines 236 are also classified into first to fourth data link lines 236a, 236b, 236c and 236d depending on a distance from the center data line 230. The first to fourth data link lines 236a, 236b, 236c and 236d respectively connected to the first to fourth data lines 230a, 230b, 230c and 230d, Namely, the first data line 230a has a first distance from the center data line 230, and the second data line 230b has a second distance, which is smaller than the first distance, from the center data line 230. The third data line 230c has a third distance, which is smaller than the second distance, from the center data line 230, and the fourth data line 230d has a fourth distance, which is smaller than the third distance, from the center data line 230.

At least one of the first to fourth data link lines 236a, 236b, 236c and 236d has a zigzag shape, i.e., a "S"-shape. The first to fourth data link lines 236a, 236b, 236c and 236d have a difference in a number of the zigzag shape such that a length of the first to fourth data link lines 236a, 236b, 236c and 236d is controlled. Namely, as the farther the data link line is from the center data line, as the smaller number of the zigzag shape the data link line has. Alternatively, the first to fourth data link lines 236a, 236b, 236c and 236d have a straight linear shape. Alternatively, the first to fourth data link lines 236a, 236b, 236c and 236d have a difference in a width to control a resistance. Namely, the first data link line 236a, which has the largest distance from the center data line 230, has the largest width, and the fourth data link line 236d, which has the smallest distance from the center data line 230, has the smallest width. As a result, a resistance deviation by a distance difference from the data drive IC 238 is compensated.

As mentioned above, the first conductive pattern 252 is electrically connected to the common line 216 via the connection part 254 such that a common voltage is applied to the first conductive pattern 252. The first conductive pattern 252 is disposed on the same layer and formed of the same material as the pixel electrode 250. Since the first conductive pattern 252 has a triangle shape, the first conductive pattern 252 has a difference in an overlapped area with the first to fourth data link lines 236a, 236b, 236c and 236d, Namely, the first conductive pattern 252 has a first overlapped area with the first data link line 236a and a second overlapped area, which is larger than the first overlapped area, with the second data link line 236b, The first conductive pattern 252 has a third overlapped area, which is larger than the second overlapped area, with the third data link line 236c and a fourth overlapped area, which is larger than the third overlapped area, with the fourth data link line 236d, Namely, an overlapped area of the first conductive pattern 252 and respective data link lines 236a, 236b, 236c and 236d is in reverse proportional to a distance between respective data lines 230a, 230b, 230c and 230d and the data drive IC 238.

Since the passivation layer (not shown) is disposed under the first conductive pattern 252 and on the first to fourth data link lines 236a, 236b, 236c and 236d, first to fourth capacitors Cp1, Cp2, Cp3 and Cp4 are generated. Namely, the first conductive pattern 252, the first data link line 236a and the passivation layer constitute the first capacitor Cp1, and the second conductive pattern 252, the second data link line 236b and the passivation layer constitute the second capacitor Cp2. The first conductive pattern 252, the third data link line 236c and the passivation layer constitute the third capacitor Cp3, and the second conductive pattern 252, the fourth data link line 236d and the passivation layer constitute the fourth capacitor Cp4.

As mentioned above, an overlapped area between the first conductive pattern 152 and the first data link line 136a is smallest, and an overlapped area between the first conductive pattern 152 and the fourth data link line 136d is largest. Accordingly, capacitance of each of the second and third capacitors Cp2 and Cp3 is larger than that of the first capacitor Cp1 and smaller than that of the fourth capacitor Cp4, and capacitance of the second capacitor Cp2 is smaller than that of the third capacitor Cp3. A signal through the data link lines 136 is delayed by the capacitors Cp1, Cp2, Cp3 and Cp4 such that a signal delay is uniformed in the first to fourth data link lines 136a, 136b, 136c and 136d due to the first to fourth capacitors Cp1, Cp2, Cp3 and Cp4 having a difference in capacitance. Particularly, without requirement in increasing of a size of the non-display region NDR, the signal delay is uniformed due to the first conductive pattern 152. Accordingly, the array substrate is adequate to the narrow bezel type LCD device.

Although not shown, a gate link lines extend from the gate line 114 to the non-display region NDR, and a second conductive pattern is disposed to overlap the gate link lines. Similar to the first conductive pattern 152, a signal delay in the gate link lines is uniformed due to the second conductive pattern.

A fabricating method of the array substrate according to the first embodiment of the present invention is explained below with reference to FIGS. 7A to 7D and 8A to 8D.

FIGS. 7A to 7D are cross-sectional views showing a fabricating process of a portion taken along the line IV-IV of FIG. 3B, and FIGS. 8A to 8D are cross-sectional views showing a fabricating process of a portion taken along the line V-V of FIG. 3A.

Figure 7A:
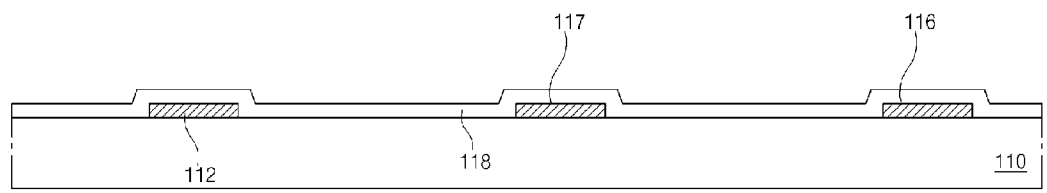
FIGS. 7A to 7D are cross-sectional views showing a fabricating process of a portion taken along the line IV-IV of FIG. 3B.
Figure 8A:
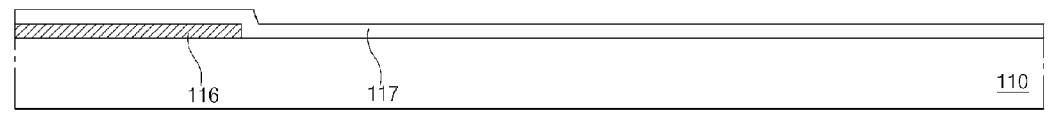
FIGS. 8A to 8D are cross-sectional views showing a fabricating process of a portion taken along the line V-V of FIG. 3A.

In FIGS. 7A and 8A, a first metal layer (not shown) is formed on the substrate 110 and patterned by a mask process to form the gate line 114 along the first direction, the gate electrode 112 extending from the gate line 114, and the common line 116 along the first direction and spaced apart from the gate line 114. At the same time, the common electrode 117 extending from the common line 116 is formed on the substrate 110 and in the pixel region P, and the gate link lines (not shown) extending from the gate line 114 to the non-display region NDR are formed on the substrate 110. The first metal layer is formed one of aluminum (Al), Al alloy, molybdenum (Mo), copper (Cu) and Cu alloy. The Al alloy may be Al-neodymium (AlNd).

Next, the gate insulating layer 118 is formed on the gate line 114, the gate electrode 112, the common line 116, the common electrode 117 and the gate link lines by depositing an inorganic insulating material, for example, silicon oxide or silicon nitride.

Figure 7B:
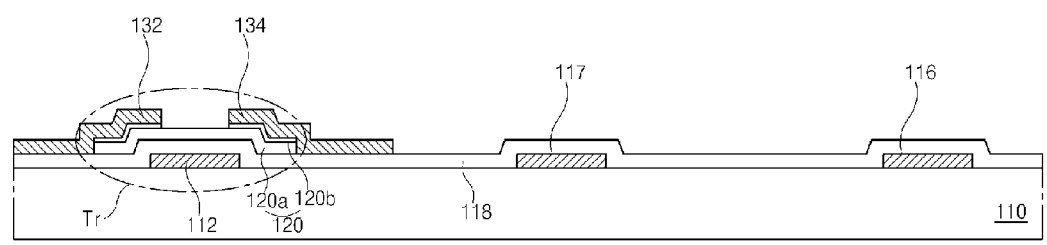
Figure 8B:
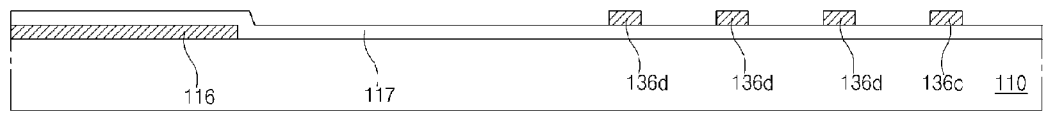

Next, in FIGS. 7B and 8B, an intrinsic amorphous silicon layer (not shown) and an impurity-doped amorphous silicon layer (not shown) are sequentially formed on the gate insulating layer 118. Then, the impurity-doped amorphous silicon layer and the intrinsic amorphous silicon layer are patterned by a mask process to form the active layer 120a and the ohmic contact layer 120b, The active layer 120a and the ohmic contact layer 120b correspond to the gate electrode 112 and constitute the semiconductor layer 120.

Next, a second metal layer (not shown) is formed on the semiconductor layer 120 and the gate insulating layer 118 and patterned by a mask process to form the data line 130, the source electrode 132, the drain electrode 134 and the data link line 136. The data line 130 is disposed on the gate insulating layer 118 and crosses the gate line 114 to define the pixel region P. The source and drain electrodes 132 and 134 are disposed on the semiconductor layer 120 and spaced apart from each other. The source electrode 132 extends from and is connected to the data line 130. A portion of the ohmic contact layer 120b exposed through a spaced between the source and drain electrodes 132 and 134 is removed such that a portion of the active layer 120a is exposed. The gate electrode 112, the gate insulating layer 118, the semiconductor layer 120, the source electrode 132 and the drain electrode 134 constitute the TFT Tr.

The data link line 136 extends from and is connected to the data line 130. The data link line 136 is disposed on the gate insulating layer 118 and positioned in the non-display region NDR. An end of the data link line 136 is defined as a data pad. The data link line 136 includes the first to fourth data link lines 136a, 136b, 136c and 136d depending on a distance from the center data line 130 corresponding to a center of the data drive IC 138.

Figure 7C:
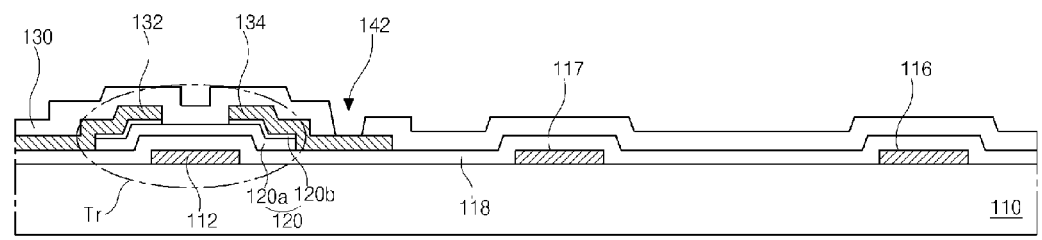
Figure 8C:
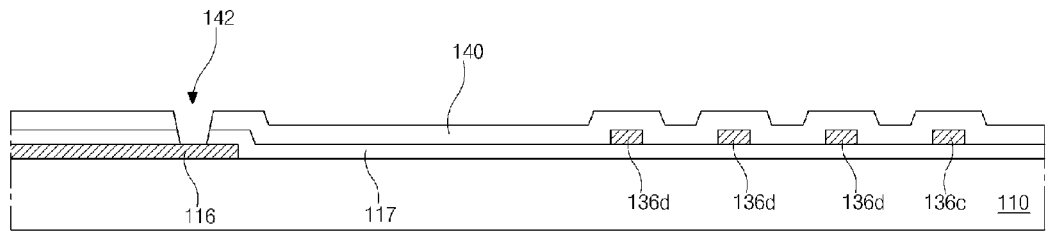

Next, in FIGS. 7C and 8C, the passivation layer 140 is formed on the source electrode 132, the drain electrode 134, the data line 130 and the data link line 136 by depositing an inorganic insulating material, for example, silicon oxide or silicon nitride. Alternatively, the passivation layer 140 may be formed of an organic insulating material, for example, benzocyclobutene (BCB) or photo-acryl. The passivation layer 140 is patterned by a mask process to form the drain contact hole 142 exposing the drain electrode 134. In addition, the passivation layer 140 and the gate insulating layer 118 under the passivation layer 140 are patterned to form the common contact hole 144 exposing the common line 116. Although not shown, a data contact hole exposing the data pad is formed through the passivation layer 140, and a gate contact hole exposing the data pad is formed through the passivation layer 140 and the gate insulating layer 118.

Figure 7D:
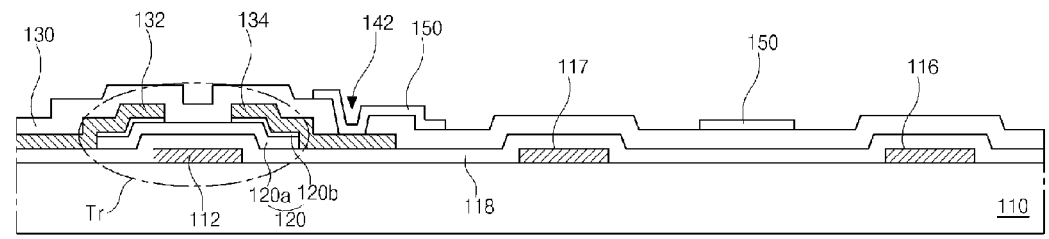
Figure 8D:
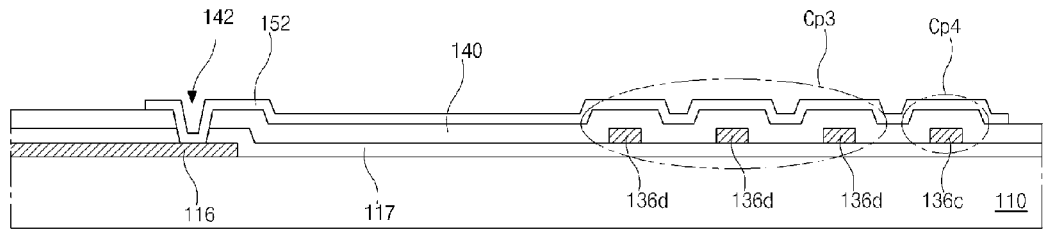

In FIGS. 7D and 8D, a transparent conductive material layer (not shown) is formed on the passivation layer 140 by depositing ITO or IZO. The transparent conductive material layer is patterned by a mask process to form the pixel electrode 150, the first conductive pattern 152 and the connection part 154. The pixel electrode 150 is positioned in the pixel region P and connected to the drain electrode 134 through the drain contact hole 142. The pixel branches of the pixel electrode 150 are alternately arranged with the common branches of the common electrode 117. The first conductive pattern 152 is positioned in the non-display region NDR and overlaps the first to fourth data link lines 136a, 136b, 136c and 136d to form first to fourth capacitors Cp1, Cp2, Cp3 and Cp4. The connection part 154 is positioned in the non-display region NDR and extends from the first conductive pattern 152. The connection part 154 contacts the common line 116 through the common contact hole 144 such that the first conductive pattern 152 is electrically connected to the common line 116. As a result, the common voltage is applied to the first conductive pattern 152. The pixel electrodes 150, the first conductive pattern 152 and the connection part 154 may be formed of MoTi.

Although not shown, a second conductive pattern is formed on the passivation layer 140 and in the non-display region NDR. Similar to the first conductive pattern 152, the second conductive pattern overlaps the gate link lines to form capacitors such that a signal delay in the gate link lines is uniformed. In addition, a gate pad electrode and a data pad electrode are formed on the passivation layer. The gate pad electrode and the data pad electrode respectively contact the gate pad and the data pad through the gate contact hole and the data contact hole.

The data drive IC (138) and the gate drive IC (not shown) are connected to the data link line 136 and the gate link line, respectively, to form the array substrate according to the present invention. In the array substrate, a signal delay is uniformed in the first to fourth data link lines 136a, 136b, 136c and 136d due to the first to fourth capacitors Cp1, Cp2, Cp3 and Cp4 having a difference in capacitance. Particularly, without requirement in increasing of a size of the non-display region NDR, the signal delay is uniformed due to the first conductive pattern 152. Accordingly, the array substrate is adequate to the narrow bezel type LCD device.

Figure 9:
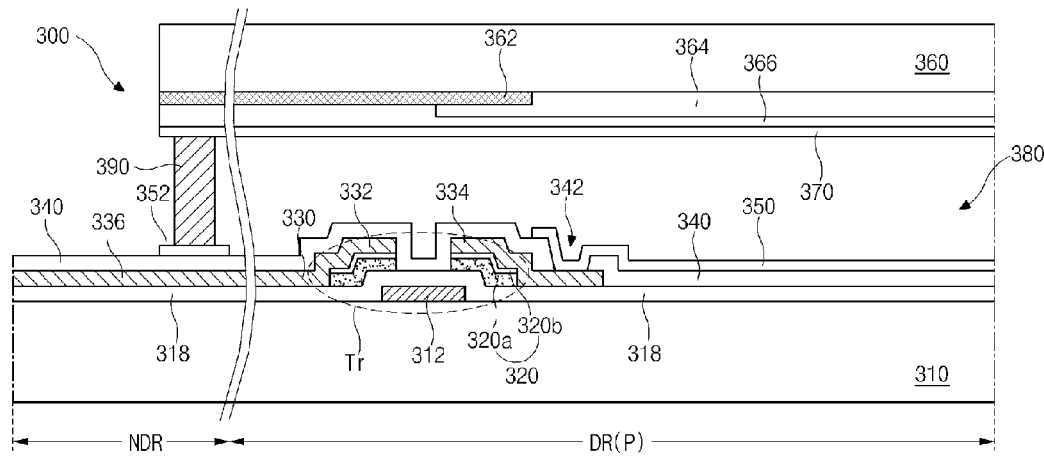
FIG. 9 is a cross-sectional view of an LCD device according to a third embodiment of the present invention.

FIG. 9 is a cross-sectional view of an LCD device according to a third embodiment of the present invention. In FIG. 9, the LCD device 300 includes a first substrate 310, a second substrate 360 facing the first substrate 310, a liquid crystal layer 380 interposed therebetween, and a seal pattern 390 for preventing leakage of the liquid crystal layer 380 at edges of the first and second substrates 310 and 360.

A display region DR and a non-display region NDR at a periphery of the display region DR are defined in the first substrate 310.

A plurality of gate lines (not shown) along a first direction and a plurality of data lines 330 are disposed on the substrate 310. The gate lines and the data lines 330 cross each other to define a plurality of pixel regions P in the display region DR.

A gate electrode 312 is disposed on the first substrate 310 and in the pixel region P, and a gate insulating layer 318 is disposed on the gate electrode 312. A semiconductor layer 320 including an active layer 320a and an ohmic contact layer 320b is disposed on the gate insulating layer 318 to overlap the gate electrode 312. The active layer 320a is formed of intrinsic amorphous silicon, and the ohmic contact layer 320b is formed of impurity-doped amorphous silicon. A source electrode 332 and a drain electrode 334 spaced apart from each other are disposed on the semiconductor layer 320. The gate electrode 312, the gate insulating layer 318, the semiconductor layer 320, the source electrode 332 and the drain electrode 334 constitute a thin film transistor Tr.

The gate electrode 312 is disposed at the same layer as the gate line and connected to the gate line. The source electrode 332 is disposed at the same layer as the data line 330 and connected to the data line 330. Namely, the TFT Tr is connected to the gate line and the data line 330.

A passivation layer 340 is disposed on the TFT Tr and includes a drain contact hole 342 exposing the drain electrode 334. A pixel electrode 350, which is formed of a transparent conductive material, for example, ITO or IZO, is disposed on the passivation layer 340. The pixel electrode 350 is connected to the drain electrode 334 through the drain contact hole 342.

A plurality of data link lines 336 respectively extending from the data lines 330 are disposed in the non-display region NDR. The data link lines 336 are disposed on the gate insulating layer 318. An end of the data link line 336 is connected to a data drive IC (not shown) such that a signal from the data drive IC is applied to the pixel electrode 350 through the data link line 336, the data line 330 and the TFT Tr.

Although not shown, an end of the data link line 136 is defined as a data pad, and a data contact hole for exposing the data pad is formed through the passivation layer 340. A data pad electrode contacting the data pad through the data contact hole may be disposed on the data pad. In this case, the data drive IC contacts the data pad electrode to be electrically connected to the data link line 336.

The passivation layer 340 covers the data link lines 336, and a first conductive pattern 352 is disposed on the passivation layer 340. The first conductive pattern 352 overlaps the data link lines 336 with the passivation layer 340 therebetween to form capacitors. Namely, an overlapped portion of each data link line 336 as a first electrode, an overlapped portion of the first conductive pattern 352 as a second electrode, and the passivation layer 340 as a dielectric material layer constitute the capacitors. The first conductive pattern 352 may be formed of the same material as the pixel electrode 350. Namely, the first conductive pattern 352 may be formed of ITO or IZO.

Although not shown, gate link lines extend from the gate lines to the non-display region NDR. And end of the gate link line is connected to a gate drive IC such that a signal from the gate drive IC is applied to the gate electrode 312 through the gate line to control the TFT Tr. In addition, a second conductive pattern overlapping the gate link lines may be disposed over the gate link lines to form capacitors.

On the other hand, a black matrix 362, a color filter layer 364, an overcoat layer 366 and a common electrode 370 are disposed on the second substrate 360. The black matrix 362 is disposed on the second substrate 360 and corresponds to the gate line, the data line 330 and the TFT Tr. The color filter layer 364 is disposed on the black matrix 362 and corresponds to the pixel region P. For example, the color filter layer 364 includes a red color filter pattern, a green color filter pattern and a blue color filter pattern.

The overcoat layer 366 to form a flat top surface is disposed on the black matrix 362 and the color filter layer 364. The common electrode 370 is disposed on an entire surface of the overcoat layer 366. The common electrode 370 generates an electric field with the pixel electrode 350 on the first substrate 310 to drive the liquid crystal layer 380.

The liquid crystal layer 380 is disposed between the first and second substrates 310 and 360. The seal pattern 390 is disposed at edges of the first and second substrates 310 and 360 and in the non-display region NDR.

The seal pattern 390 has a conductive property such that it may be called as a conductive seal pattern. For example, a plurality of conductive balls are disposed in the seal pattern 390. One end of the seal pattern 390 contacts the common electrode 370 on the second substrate 360, and the other end of the seal pattern 390 contacts a common line (not shown). As a result, a common voltage from the common line is applied to the common electrode 370 through the seal pattern 390. A portion of the other end of the seal pattern 390 contacts the first conductive pattern 352 on the first substrate 310 such that the common voltage is also applied to the first conductive pattern 352.

Although not shown, the second conductive pattern overlapping the gate link line also contacts the seal pattern 390 such that the common voltage is applied to the second conductive pattern.

In the LCD device having the above structure, capacitors is formed by the first conductive pattern 352 overlapping the data link lines 336 and the second conductive pattern overlapping the gate link line such that a signal delay deviation in the data link line 336 and in the gate link line can be prevented.

Figure 10:
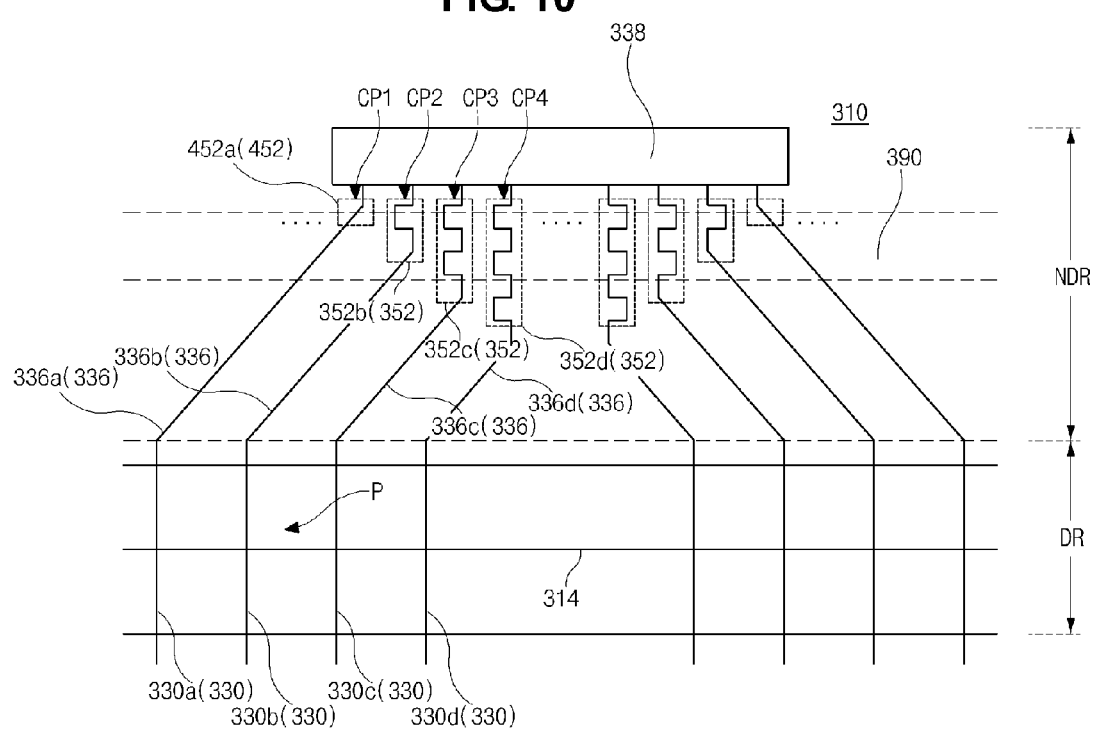
FIG. 10 is a plane view of an array substrate for the LCD device according to the third embodiment of the present invention.

FIG. 10 is a plane view of an array substrate for the LCD device according to the third embodiment of the present invention.

In FIG. 10, the gate lines 310 and the data lines 330 are disposed on the first substrate 310 and cross each other to define the plurality of pixel regions P in the display region DR.

As shown in FIG. 9, the TFT Tr connected to the gate and data lines 310 and 330 and the pixel electrode 350 connected to the TFT Tr are disposed on in the pixel region P.

The data link lines 336 respectively extending from the data lines 330 are disposed in the non-display region NDR. The data link lines 336 are connected to the data drive IC 338 such that a signal from the data drive IC 338 is applied to the data lines 330.

The data lines 330 are classified into first to fourth data lines 330a, 330b, 330c and 330d depending on a distance from the center data line 330, which is disposed at a center line of the data drive IC 338, and the data link lines 336 are also classified into first to fourth data link lines 336a, 336b, 336c and 336d depending on a distance from the center data line 330. The first to fourth data link lines 336a, 336b, 336c and 336d respectively connected to the first to fourth data lines 330a, 330b, 330c and 330d, Namely, the first to fourth data lines 330a, 330b, 330c and 330d, and the first to fourth data link lines 336a, 336b, 336c and 336d have a difference in a distance from the data drive IC 338.

Namely, the first data line 330a has a first distance from the center data line 330 or the data drive IC 338, and the second data line 330b has a second distance, which is smaller than the first distance, from the center data line 330 or the data drive IC 338. The third data line 330c has a third distance, which is smaller than the second distance, from the center data line 330 or the data drive IC 338, and the fourth data line 330d has a fourth distance, which is smaller than the third distance, from the center data line 330 or the data drive IC 338.

At least one of the first to fourth data link lines 336a, 336b, 336c and 336d has a zigzag shape, i.e., a "S"-shape. The first to fourth data link lines 336a, 336b, 336c and 336d have a difference in a number of the zigzag shape such that a length of the first to fourth data link lines 336a, 336b, 336c and 336d is controlled. Namely, as the farther the data link line is from the center data line, as the smaller number of the zigzag shape the data link line has. Alternatively, the first to fourth data link lines 336a, 336b, 336c and 336d have a straight linear shape. Alternatively, the first to fourth data link lines 336a, 336b, 336c and 336d may have a straight linear shape.

In addition, a first conductive pattern 352 including first to fourth conductive sub-patterns 352a, 352b, 352c and 352d is disposed in the non-display region NDR. Each of the first to fourth conductive sub-patterns 352a, 352b, 352c and 352d has an island shape. Namely, the first to fourth conductive sub-patterns 352a, 352b, 352c and 352d are spaced apart from each other. The first to fourth conductive sub-patterns 352a, 352b, 352c and 352d respectively overlap the first to fourth data link lines 336a, 336b, 336c and 336d.

The first conductive sub-pattern 352a has a plane area smaller than the second conductive sub-pattern 352b, and third conductive sub-pattern 352c has a plane area larger than the second conductive sub-pattern 352b and smaller than the fourth conductive sub-pattern 352d. Namely, the plane area of each of the first to fourth conductive sub-patterns 352a, 352b, 352c and 352d, which respectively overlap the first to fourth data link lines 336a, 336b, 336c and 336d, is in reverse proportional to a distance between each of the first to fourth data lines 330a, 330b, 330c and 330d and the data drive IC 338.

The seal pattern 390 is disposed in the non-display region NDR. The seal pattern 390 contacts each of the first to fourth conductive sub-patterns 352a, 352b, 352c and 352d, As mentioned above, the seal pattern 390 having a conductive property contacts the first to fourth conductive sub-patterns 352a, 352b, 352c and 352d and the common line (not shown) for providing the common voltage to the common electrode 370 (of FIG. 9). As a result, the common voltage is provided into each of the first to fourth conductive sub-patterns 352a, 352b, 352c and 352d.

Since the first conductive pattern 352 overlaps the data link lines 336 with the passivation layer 340 (of FIG. 9) between the first conductive pattern 352 and the data link lines 336, first to fourth capacitors Cp1, Cp2, Cp3 and Cp4 are formed. Namely, the first data link line 336a, the first conductive sub-pattern 352a and the passivation layer 340 constitute the first capacitor Cp1, and the second data link line 336b, the second conductive sub-pattern 352b and the passivation layer 340 constitute the second capacitor Cp2. The third data link line 336c, the third conductive sub-pattern 352c and the passivation layer 340 constitute the third capacitor Cp3, and the fourth data link line 336d, the fourth conductive sub-pattern 352d and the passivation layer 340 constitute the fourth capacitor Cp4.

An overlapped area between the first conductive sub-pattern 352a and the first data link line 336a is smallest, and an overlapped area between the fourth conductive sub-pattern 352d and the fourth data link line 336d is largest. Namely, the capacitance of the first capacitor Cp1 is smaller than that of the second capacitor Cp2. The capacitance of the third capacitor Cp3 is larger than that of the second capacitor Cp2 and smaller than that of the fourth capacitor Cp4.

The signal is delayed by each of the first to fourth capacitors Cp1, Cp2, Cp3 and Cp4. A signal delay deviation in the first to fourth data link lines 336a, 336b, 336c and 336d resulted from a distance between each of the first to fourth data lines 330a, 330b, 330c and 330d and the data drive IC 338 is compensated by the first to fourth capacitors Cp1, Cp2, Cp3 and Cp4. Particularly, without requirement in increasing of a size of the non-display region NDR, the signal delay is uniformed due to the first conductive pattern 352. Accordingly, the array substrate is adequate to the narrow bezel type LCD device.

Figure 11:
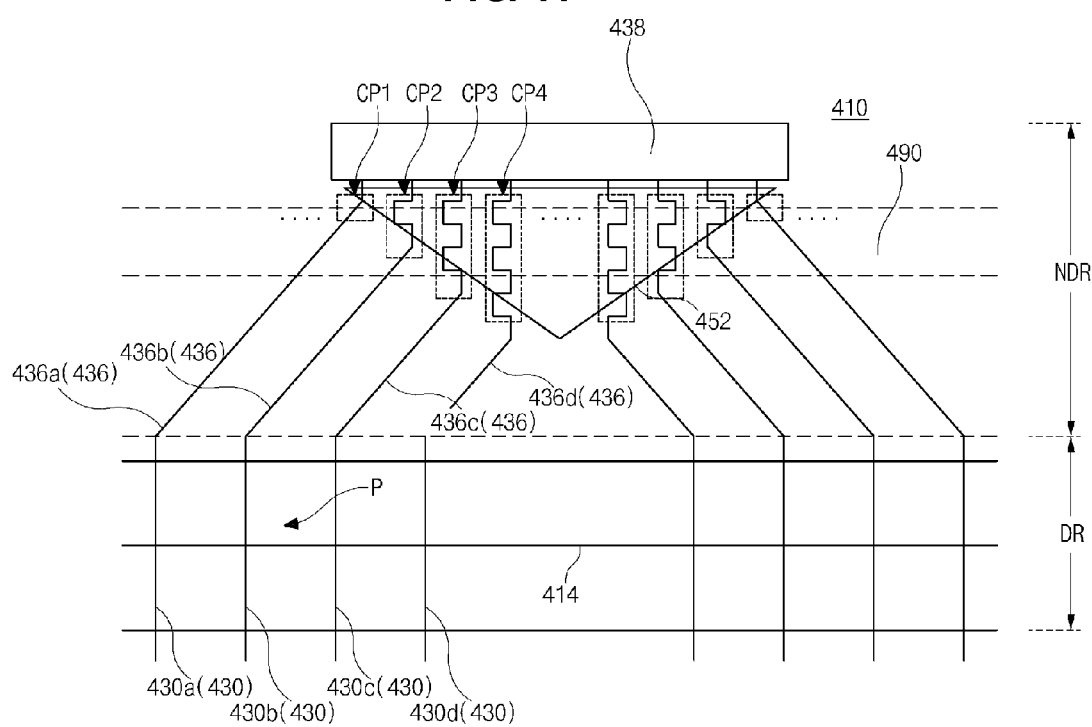
FIG. 11 is a plane view of an array substrate for the LCD device according to a fourth embodiment of the present invention.

FIG. 11 is a plane view of an array substrate for the LCD device according to a fourth embodiment of the present invention.

In FIG. 11, the gate lines 410 and the data lines 430 are disposed on the first substrate 410 and cross each other to define the plurality of pixel regions P in the display region DR.

A TFT Tr (of FIG. 9) connected to the gate and data lines 410 and 430 and the pixel electrode 350 (of FIG. 9) connected to the TFT Tr are disposed on in the pixel region P.

The data link lines 436 respectively extending from the data lines 430 are disposed in the non-display region NDR. The data link lines 436 are connected to the data drive IC 438 such that a signal from the data drive IC 438 is applied to the data lines 430.

The data lines 430 are classified into first to fourth data lines 430a, 430b, 430c and 430d depending on a distance from the center data line 430, which is disposed at a center line of the data drive IC 438, and the data link lines 436 are also classified into first to fourth data link lines 436a, 436b, 436c and 436d depending on a distance from the center data line 330. The first to fourth data link lines 436a, 436b, 436c and 436d respectively connected to the first to fourth data lines 430a, 430b, 430c and 430d, Namely, the first to fourth data lines 430a, 430b, 430c and 430d, and the first to fourth data link lines 436a, 436b, 436c and 436d have a difference in a distance from the data drive IC 438.

Namely, the first data line 430a has a first distance from the center data line 430 or the data drive IC 438, and the second data line 430b has a second distance, which is smaller than the first distance, from the center data line 430 or the data drive IC 438. The third data line 430c has a third distance, which is smaller than the second distance, from the center data line 430 or the data drive IC 438, and the fourth data line 430d has a fourth distance, which is smaller than the third distance, from the center data line 430 or the data drive IC 438.

At least one of the first to fourth data link lines 436a, 436b, 436c and 436d has a zigzag shape, i.e., a "S"-shape. The first to fourth data link lines 436a, 436b, 436c and 436d have a difference in a number of the zigzag shape such that a length of the first to fourth data link lines 436a, 436b, 436c and 436d is controlled. Namely, as the farther the data link line is from the center data line, as the smaller number of the zigzag shape the data link line has. Alternatively, the first to fourth data link lines 436a, 436b, 436c and 436d have a straight linear shape.

In addition, a conductive pattern 452 is disposed in the non-display region NDR. The conductive pattern 452 has a triangle shape and overlaps the first to fourth data link lines 436a, 436b, 436c and 436d, The first conductive pattern 452 having a reverse-triangle shape is shown.

Since the conductive pattern 452 has a triangle shape, the conductive pattern 452 has a difference in an overlapped area with the first to fourth data link lines 436a, 436b, 436c and 436d, Namely, the conductive pattern 452 has a first overlapped area with the first data link line 336a and a second overlapped area, which is larger than the first overlapped area, with the second data link line 436b, The conductive pattern 452 has a third overlapped area, which is larger than the second overlapped area, with the third data link line 436c and a fourth overlapped area, which is larger than the third overlapped area, with the fourth data link line 436d, Namely, an overlapped area of the conductive pattern 452 and respective data link lines 436a, 436b, 436c and 436d is in reverse proportional to a distance between respective data lines 430a, 430b, 430c and 430d and the data drive IC 438.

A seal pattern 490 is disposed in the non-display region NDR. The seal pattern 490 contacts each of the conductive pattern 452. The seal pattern 490 having a conductive property contacts the conductive pattern 452 and the common line (not shown) for providing the common voltage to the common electrode 370 (of FIG. 9). As a result, the common voltage is provided into each of the conductive pattern 452.

Since the conductive pattern 452 overlaps the data link lines 436 with the passivation layer 340 (of FIG. 9) between the conductive pattern 452 and the data link lines 436, first to fourth capacitors Cp1, Cp2, Cp3 and Cp4 are formed. Namely, the first data link line 436a, the conductive pattern 452 and the passivation layer 340 constitute the first capacitor Cp1, and the second data link line 436b, the conductive pattern 452 and the passivation layer 340 constitute the second capacitor Cp2. The third data link line 436c, the conductive pattern 452 and the passivation layer 340 constitute the third capacitor Cp3, and the fourth data link line 436d, the conductive pattern 452 and the passivation layer 340 constitute the fourth capacitor Cp4.

An overlapped area between the conductive pattern 452 and the first data link line 436a is smallest, and an overlapped area between the conductive pattern 452 and the fourth data link line 436d is largest. Namely, the capacitance of the first capacitor Cp1 is smaller than that of the second capacitor Cp2. The capacitance of the third capacitor Cp3 is larger than that of the second capacitor Cp2 and smaller than that of the fourth capacitor Cp4.

The signal is delayed by each of the first to fourth capacitors Cp1, Cp2, Cp3 and Cp4. A signal delay deviation in the first to fourth data link lines 436a, 436b, 436c and 436d resulted from a distance between each of the first to fourth data lines 430a, 430b, 430c and 430d and the data drive IC 438 is compensated by the first to fourth capacitors Cp1, Cp2, Cp3 and Cp4. Particularly, without requirement in increasing of a size of the non-display region NDR, the signal delay is uniformed due to the conductive pattern 452. Accordingly, the array substrate is adequate to the narrow bezel type LCD device.

Figure 12:
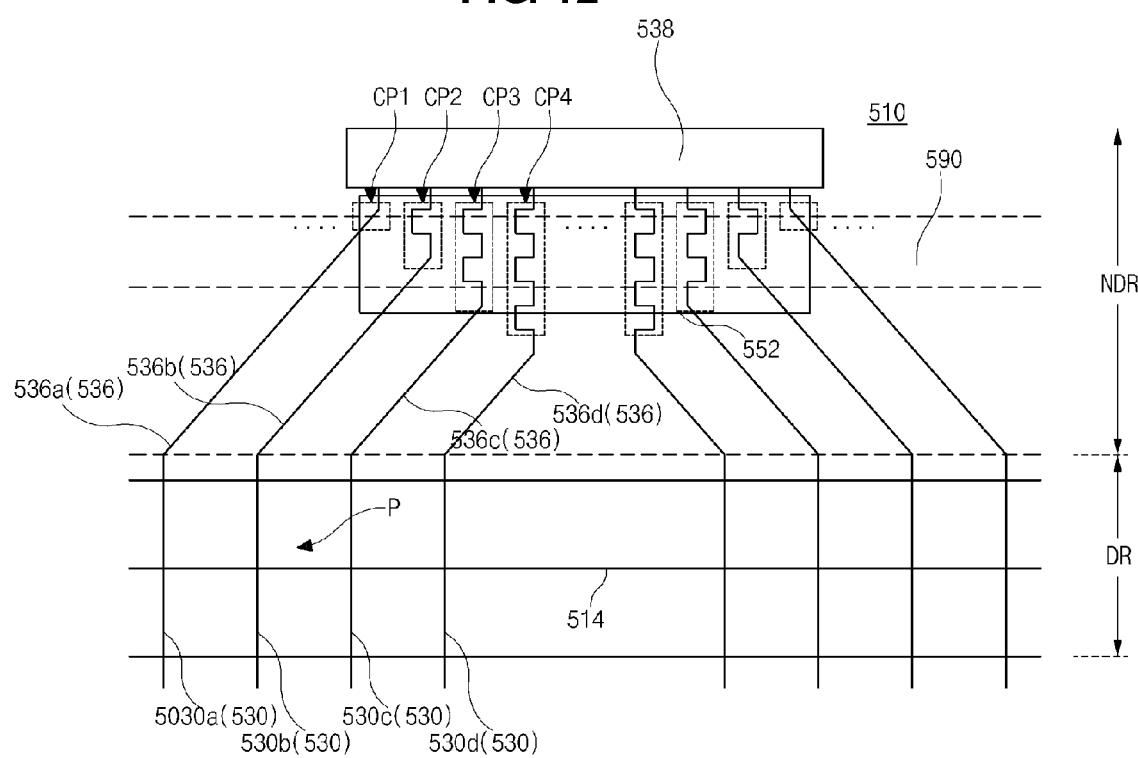
FIG. 12 is a plane view of an array substrate for the LCD device according to a fifth embodiment of the present invention.

FIG. 12 is a plane view of an array substrate for the LCD device according to a fifth embodiment of the present invention.

In FIG. 12, the gate lines 510 and the data lines 530 are disposed on the first substrate 510 and cross each other to define the plurality of pixel regions P in the display region DR.

A TFT Tr (of FIG. 9) connected to the gate and data lines 510 and 530 and the pixel electrode 550 (of FIG. 9) connected to the TFT Tr are disposed on in the pixel region P.

The data link lines 536 respectively extending from the data lines 530 are disposed in the non-display region NDR. The data link lines 536 are connected to the data drive IC 538 such that a signal from the data drive IC 538 is applied to the data lines 530.

The data lines 530 are classified into first to fourth data lines 530a, 530b, 530c and 530d depending on a distance from the center data line 530, which is disposed at a center line of the data drive IC 538, and the data link lines 536 are also classified into first to fourth data link lines 536a, 536b, 536c and 536d depending on a distance from the center data line 330. The first to fourth data link lines 536a, 536b, 536c and 536d respectively connected to the first to fourth data lines 530a, 530b, 530c and 530d, Namely, the first to fourth data lines 530a, 530b, 530c and 530d, and the first to fourth data link lines 536a, 536b, 536c and 536d have a difference in a distance from the data drive IC 538.

Namely, the first data line 530a has a first distance from the center data line 530 or the data drive IC 538, and the second data line 530b has a second distance, which is smaller than the first distance, from the center data line 530 or the data drive IC 538. The third data line 530c has a third distance, which is smaller than the second distance, from the center data line 530 or the data drive IC 538, and the fourth data line 530d has a fourth distance, which is smaller than the third distance, from the center data line 530 or the data drive IC 538.

At least one of the first to fourth data link lines 536a, 536b, 536c and 536d has a zigzag shape, i.e., a "S"-shape. The first to fourth data link lines 536a, 536b, 536c and 536d have a difference in a number of the zigzag shape such that a length of the first to fourth data link lines 536a, 536b, 536c and 536d is controlled. Namely, as the farther the data link line is from the center data line, as the smaller number of the zigzag shape the data link line has.

In addition, a conductive pattern 552 is disposed in the non-display region NDR. The conductive pattern 552 has a rectangular shape and overlaps the first to fourth data link lines 536a, 536b, 536c and 536d.

Since the data link lines 536a, 536b, 536c and 536d have the zigzag shape, the conductive pattern 552 of the rectangular shape has a difference in an overlapped area with the first to fourth data link lines 536a, 536b, 536c and 536d, Namely, the conductive pattern 552 has a first overlapped area with the first data link line 536a and a second overlapped area, which is larger than the first overlapped area, with the second data link line 536b, The conductive pattern 552 has a third overlapped area, which is larger than the second overlapped area, with the third data link line 536c and a fourth overlapped area, which is larger than the third overlapped area, with the fourth data link line 536d, Namely, an overlapped area of the conductive pattern 552 and respective data link lines 536a, 536b, 536c and 536d is in reverse proportional to a distance between respective data lines 530a, 530b, 530c and 530d and the data drive IC 538.

A seal pattern 590 is disposed in the non-display region NDR. The seal pattern 590 contacts each of the conductive pattern 552. The seal pattern 590 having a conductive property contacts the conductive pattern 552 and the common line (not shown) for providing the common voltage to the common electrode 370 (of FIG. 9). As a result, the common voltage is provided into each of the conductive pattern 552.

Since the conductive pattern 552 overlaps the data link lines 536 with the passivation layer 340 (of FIG. 9) between the conductive pattern 552 and the data link lines 536, first to fourth capacitors Cp1, Cp2, Cp3 and Cp4 are formed. Namely, the first data link line 536a, the conductive pattern 552 and the passivation layer 340 constitute the first capacitor Cp1, and the second data link line 536b, the conductive pattern 552 and the passivation layer 340 constitute the second capacitor Cp2. The third data link line 536c, the conductive pattern 552 and the passivation layer 340 constitute the third capacitor Cp3, and the fourth data link line 536d, the conductive pattern 552 and the passivation layer 340 constitute the fourth capacitor Cp4.

An overlapped area between the conductive pattern 552 and the first data link line 536a is smallest, and an overlapped area between the conductive pattern 552 and the fourth data link line 536d is largest. Namely, the capacitance of the first capacitor Cp1 is smaller than that of the second capacitor Cp2. The capacitance of the third capacitor Cp3 is larger than that of the second capacitor Cp2 and smaller than that of the fourth capacitor Cp4.

The signal is delayed by each of the first to fourth capacitors Cp1, Cp2, Cp3 and Cp4. A signal delay deviation in the first to fourth data link lines 536a, 536b, 536c and 536d resulted from a distance between each of the first to fourth data lines 530a, 530b, 530c and 530d and the data drive IC 538 is compensated by the first to fourth capacitors Cp1, Cp2, Cp3 and Cp4. Particularly, without requirement in increasing of a size of the non-display region NDR, the signal delay is uniformed due to the conductive pattern 552. Accordingly, the array substrate is adequate to the narrow bezel type LCD device.

The above principle can be applied to the gate drive IC, the gate link lines and the gate lines. In addition, the data link lines may have a difference in a width to control a resistance of the data link lines.

Hereinafter, a fabricating method for the LCD device according to third embodiment of the present invention will be explained below with reference to FIGS. 9 and 10.

First, a first metal layer (not shown) is formed on the substrate 310 and patterned by a mask process to form the gate line 314 along the first direction, the gate electrode 312 extending from the gate line 314, and the common line 316 along the first direction and spaced apart from the gate line 314. At the same time, the gate link lines (not shown) extending from the gate line 314 to the non-display region NDR are formed on the substrate 310. The first metal layer is formed one of aluminum (Al), Al alloy, molybdenum (Mo), copper (Cu) and Cu alloy. The Al alloy may be Al-neodymium (AlNd). As described below, the common line may be formed at the same layer as the data line.

Next, the gate insulating layer 318 is formed on the gate line 314, the gate electrode 312, the common line 316, common line and the gate link lines by depositing an inorganic insulating material, for example, silicon oxide or silicon nitride.

Next, an intrinsic amorphous silicon layer (not shown) and an impurity-doped amorphous silicon layer (not shown) are sequentially formed on the gate insulating layer 318. Then, the impurity-doped amorphous silicon layer and the intrinsic amorphous silicon layer are patterned by a mask process to form the active layer 320a and the ohmic contact layer 320b.

The active layer 320a and the ohmic contact layer 320b correspond to the gate electrode 312 and constitute the semiconductor layer 320.

Next, a second metal layer (not shown) is formed on the semiconductor layer 320 and the gate insulating layer 318 and patterned by a mask process to form the data line 330, the source electrode 332, the drain electrode 334 and the data link line 336. When the common line is not formed with the gate line 314, the common line is formed in this step. The data line 330 is disposed on the gate insulating layer 318 and crosses the gate line 314 to define the pixel region P. The source and drain electrodes 332 and 334 are disposed on the semiconductor layer 320 and spaced apart from each other. The source electrode 332 extends from and is connected to the data line 330. A portion of the ohmic contact layer 320b exposed through a spaced between the source and drain electrodes 332 and 334 is removed such that a portion of the active layer 320a is exposed. The gate electrode 312, the gate insulating layer 318, the semiconductor layer 320, the source electrode 332 and the drain electrode 334 constitute the TFT Tr.

The data link line 336 extends from and is connected to the data line 330. The data link line 336 is disposed on the gate insulating layer 318 and positioned in the non-display region NDR. An end of the data link line 336 is defined as a data pad. The data link line 336 includes the first to fourth data link lines 336a, 336b, 336c and 336d depending on a distance from the center data line 330 corresponding to a center of the data drive IC 338.

Next, the passivation layer 340 is formed on the source electrode 332, the drain electrode 334, the data line 330 and the data link line 336 by depositing an inorganic insulating material, for example, silicon oxide or silicon nitride. Alternatively, the passivation layer 340 may be formed of an organic insulating material, for example, benzocyclobutene (BCB) or photo-acryl. The passivation layer 340 is patterned by a mask process to form the drain contact hole 342 exposing the drain electrode 334. In addition, the passivation layer 340 and the gate insulating layer 318 under the passivation layer 340 are patterned to form the common line contact hole (not shown) exposing the common line. When the common line is formed with the data line 330, the common line contact hole is formed through the passivation layer 340. Although not shown, a data contact hole exposing the data pad is formed through the passivation layer 340, and a gate contact hole exposing the data pad is formed through the passivation layer 340 and the gate insulating layer 318.

Next, a transparent conductive material layer (not shown) is formed on the passivation layer 340 by depositing ITO or IZO. The transparent conductive material layer is patterned by a mask process to form the pixel electrodes 350 and the first conductive pattern 352. At the same time, the second conductive pattern (not shown) may be formed to overlap the gate link lines. In addition, the gate pad electrode contacting the gate pad and the data pad electrode contacting the data pad electrode may be formed. The pixel electrodes 350 are positioned in the pixel region P and connected to the drain electrode 334 through the drain contact hole 342. The first conductive pattern 352 is positioned in the non-display region NDR and overlaps the first to fourth data link lines 336a, 336b, 336c and 336d to form first to fourth capacitors Cp1, Cp2, Cp3 and Cp4.

The black matrix 362 is formed on the second substrate 360. The black matrix 362 has an opening corresponding to the pixel region P. The color filter layer 364 is formed on the black matrix 362 and in the opening of the black matrix 362 to correspond to the pixel region. Next, the overcoat layer 366 is formed on the black matrix 362 and the color filter layer 364. The common electrode 370 is formed on the overcoat layer 366. The common electrode 370 may be formed of ITO or IZO.

Next, the seal pattern 390 having a conductive property is formed on the first substrate 310 to contact the first conductive pattern 352 or the second substrate 360 to contact the common electrode 370. The first and second substrates 310 and 360 are attached to each other such that the seal pattern 390 contacts both the first conductive pattern 352 and the common electrode 370. The seal pattern 390 also contacts the common line. Accordingly, the common voltage from the common line is applied to both the common electrode 370 and the first conductive pattern 352. In addition, the seal pattern 390 contacts the second conductive pattern overlapping the gate link lines.

By injecting the liquid crystal layer into a space between the first and second substrates 310 and 360, the LCD device according to the present invention is obtained.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An array substrate for a liquid crystal display device, comprising:
a gate line on a substrate including a display region and a non-display region at a periphery of the display region;
a common line on the substrate;
a data drive integrated circuit in the non-display region;
first and second data lines crossing the gate line to define a pixel region in the display region, the first and second data lines having a difference in a distance from the data drive integrated circuit;
first and second data link lines connected to the data drive integrated circuit, the first and second data link lines respectively connected to the first and second data lines;
a thin film transistor in the pixel region connected to the gate line and one of the first and second data lines;
a pixel electrode in the pixel region and connected to the thin film transistor; and
a first conductive pattern in the non-display region and connected to the common line such that a common voltage is applied to the first conductive pattern, the first conductive pattern overlapping the first and second data link lines to form first and second capacitors, respectively.

2. The substrate according to claim 1, further comprising a common electrode including a plurality of common branches connected to the common line, wherein the pixel electrode includes a plurality of pixel branches alternately arranged with the common branches, and the common electrode is connected to the common line.

3. The substrate according to claim 1, wherein the second data line is closer to the data drive integrated circuit than the first data line, and a capacitance of the second capacitor is larger than that of the first capacitor.

4. The substrate according to claim 1, wherein the first conductive pattern has a triangle shape.

5. The substrate according to claim 1, wherein each of the first and second data link lines has a zigzag shape, and a number of the zigzag shape of the first data link line is greater than that of the zigzag shape of the second data link line.

6. The substrate according to claim 1, further comprising a connection part extending from the first conductive pattern and contacting the common line.

7. The substrate according to claim 6, further comprising:
a gate insulating layer on the gate line and the common line; and
a passivation layer on the first and second data lines and the first and second data link lines,
wherein the passivation layer and the gate insulating layer has a contact hole exposing the common line, and the connection part on the passivation layer contacts the common line through the contact hole.

8. The substrate according to claim 1, further comprising:
a gate drive integrated circuit in the non-display region;
first and second gate link lines connected to the gate drive integrated circuit; and
a second conductive pattern in the non-display region and connected to the common line such that a common voltage is applied to the second conductive pattern, the second conductive pattern overlapping the first and second gate link lines to form third and fourth capacitors, respectively,
wherein the gate line includes first and second gate lines respectively connected to the first and second gate link lines.

9. The substrate according to claim 8, wherein the second gate line is closer to the gate drive integrated circuit than the first gate line, and a capacitance of the fourth capacitor is larger than that of the third capacitor.

10. The substrate according to claim 1, wherein the pixel electrode has a plate shape covering the pixel region.

11. A method of fabricating an array substrate for a liquid crystal display device, comprising:
forming a gate line and a common line on a substrate including a display region and a non-display region at a periphery of the display region;
forming first and second data lines and first and second data link lines, the first and second data line crossing the gate line to define a pixel region in the display region, the first and second data link lines respectively connected to the first and second data lines;
forming a thin film transistor in the pixel region and connected to the gate line and one of the first and second data lines;
forming a pixel electrode and a first conductive pattern, the pixel electrode in the pixel region and connected to the thin film transistor, the first conductive pattern in the non-display region and connected to the common line such that a common voltage is applied to the first conductive pattern, the first conductive pattern overlapping the first and second data link lines to form first and second capacitors, respectively; and
forming a data drive integrated circuit in the non-display region and connected to each of the first and second data link lines,
wherein the first and second data lines have a difference in a distance from the data drive integrated circuit.

12. The method according to claim 11, further comprising forming a common electrode including a plurality of common branches connected to the common line, wherein the pixel electrode includes a plurality of pixel branches alternately arranged with the common branches, and the common electrode is connected to the common line.

13. The method according to claim 11, wherein the second data line is closer to the data drive integrated circuit than the first data line, and a capacitance of the second capacitor is larger than that of the first capacitor.

14. The method according to claim 11, wherein the first conductive pattern has a triangle shape.

15. The method according to claim 11, wherein each of the first and second data link lines has a zigzag shape, and a number of the zigzag shape of the first data link line is greater than that of the zigzag shape of the second data link line.

16. The method according to claim 11, further comprising forming a connection part extending from the first conductive pattern and contacting the common line.

17. The method according to claim 16, further comprising:
forming a gate insulating layer on the gate line and the common line;
forming a passivation layer on the first and second data lines and the first and second data link lines; and
forming a contact hole through the passivation layer and the gate insulating layer to expose the common line,
wherein the connection part on the passivation layer contacts the common line through the contact hole.

18. The method according to claim 11, further comprising:
forming first and second gate link lines;
forming a second conductive pattern in the non-display region and connected to the common line such that a common voltage is applied to the second conductive pattern, the second conductive pattern overlapping the first and second gate link lines to form third and fourth capacitors, respectively; and
forming a gate drive integrated circuit in the non-display region and connected to each of the first and second gate link lines,
wherein the gate line includes first and second gate lines respectively connected to the gate link lines.

19. The method according to claim 18, wherein the second gate line is closer to the gate drive integrated circuit than the first gate line, and a capacitance of the fourth capacitor is larger than that of the third capacitor.

20. The method according to claim 11, wherein the pixel electrode has a plate shape covering the pixel region.

21. The substrate according to claim 1, wherein the first conductive pattern is disposed in the non-display region comprising a triangle shape, wherein each of the first and second data link lines are disposed in the non-display region comprising a zigzag shape overlapping the first conductive pattern to form the first and second capacitors, and wherein a number of the zigzag shape of the first data link line is greater than that of the zigzag shape of the second data link line.

22. The method according to claim 11, wherein the first conductive pattern is disposed in the non-display region comprising a triangle shape, wherein each of the first and second data link lines are disposed in the non-display region comprising a zigzag shape overlapping the first conductive pattern to form the first and second capacitors, and wherein a number of the zigzag shape of the first data link line is greater than that of the zigzag shape of the second data link line.

* * * * *